United States Patent
Ichino et al.

(10) Patent No.: US 12,334,316 B2
(45) Date of Patent: Jun. 17, 2025

(54) PLASMA PROCESSING APPARATUS AND PLASMA PROCESSING METHOD

(71) Applicant: Hitachi High-Tech Corporation, Tokyo (JP)

(72) Inventors: Takamasa Ichino, Tokyo (JP); Kohei Sato, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 1129 days.

(21) Appl. No.: 17/276,730

(22) PCT Filed: Apr. 21, 2020

(86) PCT No.: PCT/JP2020/017141
§ 371 (c)(1),
(2) Date: Mar. 16, 2021

(87) PCT Pub. No.: WO2021/214854
PCT Pub. Date: Oct. 28, 2021

(65) Prior Publication Data
US 2022/0115216 A1   Apr. 14, 2022

(51) Int. Cl.
*H01J 37/32*     (2006.01)
*H01L 21/3065*   (2006.01)

(52) U.S. Cl.
CPC .... *H01J 37/32724* (2013.01); *H01L 21/3065* (2013.01); *H01J 2237/334* (2013.01)

(58) Field of Classification Search
None
See application file for complete search history.

(56) References Cited

U.S. PATENT DOCUMENTS

| 5,558,717 A | 9/1996 | Zhao et al. |
| 6,565,662 B2 | 5/2003 | Amano et al. |

(Continued)

FOREIGN PATENT DOCUMENTS

| JP | H08227859 A | 9/1996 |
| JP | 2005-016379 A | 6/2005 |

(Continued)

OTHER PUBLICATIONS

Circumference of a Circle via https://byjus.com/maths/circumference-of-a-circle/ (Year: 2020).*

(Continued)

*Primary Examiner* — Binh X Tran
(74) *Attorney, Agent, or Firm* — Miles & Stockbridge, P.C.

(57) ABSTRACT

A plasma processing apparatus or method that improves the yield of wafer processing, including a sample stand on which the wafer is mounted; plural heaters which are arranged in three or more regions in the radial direction including a circular region concentrically arranged around the center and ring-like regions surrounding the outer periphery on plural radii in the radial direction from the center toward the outer peripheral side, and which include one arranged in each of plural arc-like regions divided in the circumferential direction around the center of at least one of the ring-like regions; plural temperature sensors arranged in the radial direction and the number of which is smaller than that of heaters; and a control unit which adjusts the output of each of the plural heaters according to the output from the temperature sensor so that the temperature of the sample stand becomes closer to a target value.

6 Claims, 7 Drawing Sheets

(56) References Cited

U.S. PATENT DOCUMENTS

| | | |
|---|---|---|
| 8,968,474 B2 | 3/2015 | Lim et al. |
| 10,692,784 B2 | 6/2020 | Ichino et al. |
| 2003/0003749 A1 | 1/2003 | Sexton et al. |
| 2005/0193953 A1 | 9/2005 | Makino et al. |
| 2012/0091871 A1 | 4/2012 | Lim et al. |
| 2014/0216657 A1 | 8/2014 | Kusumoto et al. |
| 2015/0214014 A1 | 7/2015 | Sato et al. |
| 2016/0155617 A1* | 6/2016 | Kusumoto ........ H01L 21/67069 156/345.27 |
| 2016/0217976 A1 | 7/2016 | Uemura et al. |
| 2016/0372305 A1 | 12/2016 | Uemura et al. |
| 2017/0309510 A1 | 10/2017 | Maehata et al. |
| 2018/0211893 A1 | 7/2018 | Ichino et al. |
| 2019/0157053 A1 | 5/2019 | Isomura et al. |
| 2019/0267219 A1 | 8/2019 | Uemura et al. |
| 2022/0389575 A1 | 12/2022 | Uemura et al. |

FOREIGN PATENT DOCUMENTS

| | | |
|---|---|---|
| JP | 2005-252201 A | 9/2005 |
| JP | 2015141908 A | 8/2015 |
| JP | 2016018918 A | 2/2016 |
| JP | 2016136624 A | 7/2016 |
| JP | 2018078328 A | 5/2018 |
| JP | 2018120881 A | 8/2018 |
| JP | 2019140155 A | 8/2019 |
| KR | 20150089907 | 8/2015 |
| TW | I645491 B | 12/2018 |
| TW | 201933472 A | 8/2019 |

OTHER PUBLICATIONS

Notice of Allowance mailed Mar. 9, 2023 in U.S. Appl. No. 14/468,397.
Search Report mailed Jun. 16, 2020 in corresponding International Application No. PCT/JP2020/017141.
Written Opinion mailed Jun. 16, 2020 in corresponding International Application No. PCT/JP2020/017141.
Office Action mailed Sep. 7, 2021 in U.S. Appl. No. 14/468,397.
Office Action mailed May 23, 2022 in Taiwanese Application No. 110105885.
Office Action mailed Aug. 13, 2018 in Korean Application No. 10-2017-0112446.
Office Action mailed Jun. 20, 2019 in U.S. Appl. No. 15/715,717.
Office Action mailed Oct. 24, 2019 in U.S. Appl. No. 15/715,717.
Allowance mailed Feb. 12, 2020 in U.S. Appl. No. 15/715,717.

* cited by examiner

PLASMA PROCESSING APPARATUS AND PLASMA PROCESSING METHOD

TECHNICAL FIELD

The present invention relates to a plasma processing apparatus or a plasma processing method for processing a substrate-like sample such as a semiconductor wafer to be processed that is mounted on a sample stand arranged in a processing chamber inside a vacuum container by using plasma formed in the processing chamber, and also relates to a plasma processing apparatus or a plasma processing method that includes plural heaters arranged in a circle of a center part and plural ring-like regions surrounding the outer periphery of the circle inside an upper part of the sample stand to process the wafer while adjusting the temperature by heating from the heaters.

BACKGROUND ART

In the plasma processing apparatus, in order to reduce the time required for etching a so-called multilayer film in which plural films formed on the surface of a plate-like sample such as a semiconductor wafer (hereinafter, also simply referred to as a wafer) are laminated, vertically adjacent films are processed in the same processing chamber without removing the wafer outside the processing chamber between the processes of the respective films.

In such a process, it is important to adjust the temperature of the sample stand arranged in the processing chamber to a suitable temperature to process the wafer. Therefore, a heater is incorporated in the sample stand of the plasma processing apparatus, and in the case where the wafer is processed, the temperature is adjusted to a temperature suitable for processing to improve processing accuracy.

As a prior art provided with such a sample stand having a heater, for example, the disclosure of Japanese Unexamined Patent Application Publication No. 2018-120881 (Patent Literature 1) has been known. The prior art discloses a configuration in which a sample stand arranged in a processing chamber inside a vacuum container has a detachable upper part, and the upper part includes a disk-like base material made of metal having a flow path inside which a refrigerant flows; a dielectric film in which a film-like electrode for electrostatically adsorbing a wafer that is a sample is arranged while covering the upper surface of the base material; plural film-like heaters which are arranged under plural regions of the upper surface of the dielectric film, to each of which electric power from a power supply is supplied to generate heat, and which heat the wafer; and plural temperature sensors arranged inside equipment under plural regions where the respective heaters are arranged. In addition, the prior art shows that the output of each heater is adjusted based on the temperature detected by the temperature sensor located at the upper part of the base material under the corresponding region, and the temperature and the distribution thereof of the region of the wafer located above to which each region of the upper surface of the dielectric film of the sample stand corresponds can be made close to the expected temperature and distribution thereof with high accuracy to improve the yield of wafer processing.

In addition, Japanese Unexamined Patent Application Publication No. 2019-140155 (Patent Literature 2) discloses a configuration in which a film-like heater is arranged in a center part and plural ring-like regions surrounding the center part on the outer peripheral side when viewed from above a sample stand inside the upper part of the sample stand arranged in a processing chamber inside a vacuum container, and plural heaters are arranged in respective arc-like zones divided in the circumferential direction around the center of the sample stand having a cylindrical shape in the ring-like regions. In particular, the prior art discloses that the zone is divided into a circular zone at the center part, an outermost peripheral region in which arc-like heaters are arranged in the plural arc-like zones, and an intermediate region which is located in the middle therebetween in the radial direction of the sample stand and in which the arc-like heaters are arranged in the plural arc-like zones, and the output of the heater is adjusted in each zone to control the temperature of the wafer and the distribution thereof with high accuracy, thereby improving the accuracy of wafer processing.

CITATION LIST

Patent Literature

Patent Literature 1: Japanese Unexamined Patent Application Publication No. 2018-120881 Literature 2: Japanese Unexamined Patent Application Publication No. 2019-140155

SUMMARY OF INVENTION

Technical Problem

In the above-described prior art, a problem arises because consideration is insufficient for the following points.

That is, in the manufacture of semiconductor devices in which demand for further miniaturization is increased, both higher processing accuracy and a higher yield have been required in recent years. Patent Literature 1 relates to a technique having a configuration in which plural film-like heaters are connected to a power supply inside a dielectric film covering the upper surface of a base material, and each of the plural temperature sensors is arranged inside the base material under the region of the upper surface of the dielectric film to which each heater corresponds. In this configuration, it is necessary to store the temperature sensors the number of which is the same as that of heaters inside the base material.

Likewise, the configuration of Patent Literature 2 is the same as that of Patent Literature 1 in that a temperature sensor is provided inside a base material under each of plural regions where heaters are arranged, and the temperature sensors the number of which is the same as that of heaters are arranged.

If the temperature of the wafer and the distribution thereof are precisely adjusted in order to improve the processing accuracy of the wafer, it is necessary to mount more heaters and sensors on the sample stand and to adjust the heating and the amount of heat generation of the heaters and the temperature of the base material or the wafer due to the heating in a smaller region, the distances between structures or members such as a through hole for storing plural pins for vertically moving the wafer arranged inside the base material of the sample stand, a refrigerant flow path, a connector for high-frequency power, and a flow path of a heat transfer gas such as He supplied to a gap between the wafer and the upper surface of the dielectric film become small, and operations interfere with each other. Thus, there is a possibility that the accuracy of the temperature to be realized is lowered.

Further, the prior art does not consider a problem that a large number of pairs of temperature sensors and heaters mounted on the sample stand increases the cost, and performance is deteriorated if the cost is suppressed.

An object of the present invention is to provide a plasma processing apparatus or a plasma processing method that improves the yield of wafer processing by reducing the variation of the temperature of a sample stand on which the wafer is mounted.

Solution to Problem

The above-described object is realized by a plasma processing apparatus comprising: a processing chamber which is arranged inside a vacuum container and forms plasma by arranging a wafer to be processed therein; a sample stand which is arranged inside the processing chamber and has a cylindrical shape on the upper surface of which the wafer is mounted; plural heaters which are arranged inside the sample stand, and are arranged in three or more regions in the radial direction including a circular region concentrically arranged around the center and ring-like regions surrounding the outer periphery of the circular region on plural radii in the radial direction from the center toward the outer peripheral side, the heaters including one arranged in each of plural arc-like regions divided in the circumferential direction around the center of at least one of the ring-like regions; plural temperature sensors which are arranged inside the sample stand under the respective regions in the radial direction and the number of which is smaller than that of heaters; and a control unit which adjusts the output of each of the plural heaters to a predetermined value after adjusting the output of each of the plural heaters according to the output from the temperature sensor so that the temperature of the sample stand becomes closer to a target value.

In addition, the above-described object is realized by a plasma processing method in which a wafer to be processed is mounted on a sample stand arranged in a processing chamber inside a vacuum container and plasma is formed in the processing chamber to process the wafer, wherein the sample stand having a cylindrical shape has therein a plurality of heaters which are arranged in three or more regions in a radial direction including a circular region concentrically arranged around a center and ring-like regions surrounding an outer periphery of the circular region on a plurality of radii in the radial direction from the center toward an outer peripheral side and which include one of the plurality of heaters arranged in each of a plurality of arc-like regions divided in the circumferential direction around the center of at least one of the ring-like regions, and a plurality of temperature sensors which are arranged inside the sample stand under the respective regions in the radial direction and a number of which is smaller than that of the plurality of heaters, the processing method comprising a first step and a second step of processing the wafer; and a transition step which occurs between the first and second steps of processing the wafer in which a temperature of the wafer or the sample stand is changed from a first temperature in the first step to a second temperature in the second step. The transition step further comprises adjusting an output of each of the plurality of heaters by a feedback control of an output from the temperature sensor so that the temperature of the sample stand becomes closer to a target value, and the second processing step after the transition step, further comprises adjusting an amount of power supplied to each of the plurality of heaters to match or maintain a predetermined value which is detected by using data obtained in advance indicating a relation between the temperature of the sample stand and the amount of power supplied to each of the plurality of heaters.

Advantageous Effects of Invention

According to the present invention, it is possible to provide a plasma processing apparatus or a plasma processing method that improves the yield of wafer processing.

DESCRIPTION OF EMBODIMENTS

An embodiment of the present invention will be described below using the drawings.

First Embodiment

Hereinafter, the embodiment of the present invention will be described using FIGS. 1 to 7B.

Figure 1:
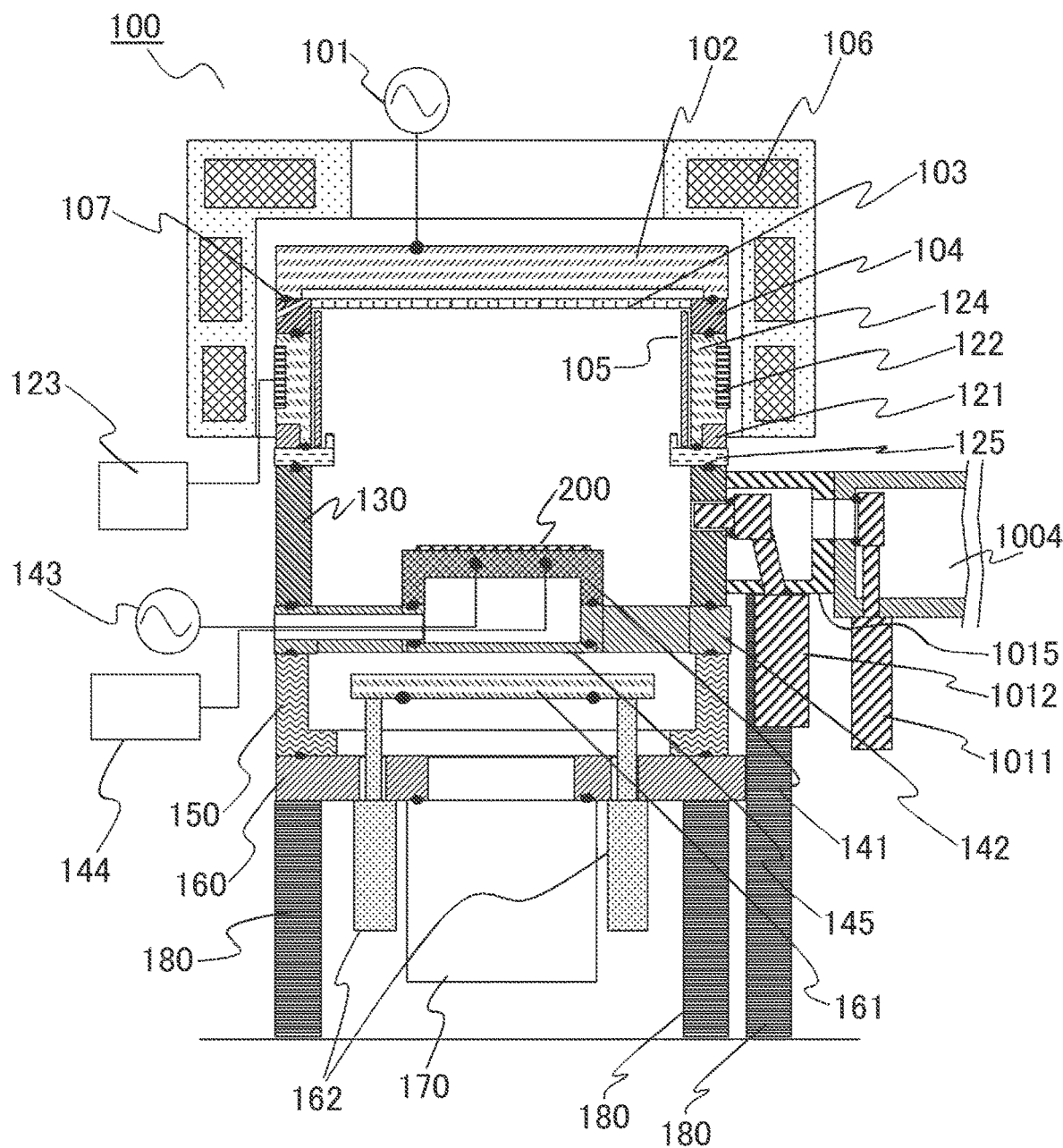
FIG. 1 is a vertical cross-sectional view for schematically showing an outline of a configuration of a plasma processing apparatus according to an embodiment of the present invention.

FIG. 1 is a vertical cross-sectional view for schematically showing an outline of a configuration of a plasma processing apparatus according to the embodiment of the present invention. In particular, FIG. 1 shows a schematic diagram of a configuration of the main part including a vacuum container in a plasma processing apparatus 100.

The plasma processing apparatus 100 shown in FIG. 1 includes a vacuum container including an upper container 130 and a lower container 150, a lower exhaust pump 170 arranged while being connected thereto, an upper first high-frequency power supply 101, and a solenoid coil 106. Each of the upper container and the lower container has an inner wall whose horizontal cross section is in a circular shape, and a sample stand 141 having a cylindrical shape is arranged at the center part inside the inner wall.

The outer walls of the upper container 130 and the lower container 150 configure a vacuum partition wall. The sample stand 141 is held by support beams provided in a sample stand base 142, and the support beams are arranged axisymmetrically with respect to the central axis of the sample stand in the vertical direction (that is, the shape of a gas flow path with respect to the central axis of the sample stand is substantially coaxial axisymmetric).

Since a gas or the like (a process gas and particles and reaction products in plasma) in a space on the sample stand 141 in the upper container 130 passes through a space between the support beams to be exhausted through the lower container 150, the flow of the gas in the circumferential direction of the sample stand 141 on which a wafer 200 that is an object to be processed (sample) is placed is uniformed, and the wafer 200 can be uniformly processed. Note that since the sample stand base 142 has a ring shape having the support beams and this ring portion is held around the lower container and the upper container that are the vacuum containers and is sealed in vacuum, it is possible to cope with an increase in the weight of the sample stand and the like.

In the embodiment, the vacuum container is configured using plural members including the cylindrical lower container 150, the ring-like sample stand base 142 with the support beams, the cylindrical upper container 130, an earth ring 125, a cylindrical discharge block 124, and a gas introduction ring 104 all of which are sequentially laminated on the base plate 160, and each of the members is sealed in vacuum by an O-ring 107. Inside the discharge block 124, a cylindrical quartz inner cylinder 105 is arranged. In addition, the sample stand 141 having a sample stand bottom lid 145 is fixed to the sample stand base 142 to configure a sample stand unit 140, and the discharge block 124 to which a heater 122 is attached is fixed to a discharge block base 121 to configure a discharge block unit.

In addition, the upper container 130, the lower container 150, and the base plate 160 have flanges, and the upper container 130 and the lower container 150 are screwed to the base plate 160 at the flanges. Note that a processing chamber which is a cylindrical space to be formed and into the inside of which a gas is introduced and an electric field and a magnetic field are supplied to form plasma is arranged inside the vacuum container in the embodiment. The inner side of the member configuring the container surrounding the processing chamber has a cylindrical shape, but the horizontal cross section of the outer wall may have a rectangular shape or other shapes rather than a circular shape.

Above the processing chamber, a lid member 102 having a disk shape configuring the vacuum container and a shower plate 103 having a disk shape configuring a ceiling surface of the processing chamber under the lid member are arranged. The lid member 102 and the shower plate 103 are members made of a dielectric material such as quartz. Therefore, these members are configured so that a high-frequency electric field such as microwaves, UHF waves, and VHF waves can pass through, and an electric field from the first high-frequency power supply arranged above passes through these members to be supplied to the inside of the processing chamber. In addition, forming means (solenoid coil) 106 of a magnetic field is arranged around the outer periphery of the outer side wall of the vacuum container, and is configured to be capable of supplying the generated magnetic field to the processing chamber.

Introduction holes for a treatment gas that are plural through holes are arranged in the shower plate 103, and the treatment gas introduced from the gas introduction ring 104 is supplied to the inside of the processing chamber through the introduction holes. The introduction holes of the shower plate 103 are arranged in an axisymmetric region around the central axis 290 of the sample stand 141 above the mounting surface of the sample that is the upper surface of the sample stand 141, and a treatment gas having passed through the uniformly-arranged introduction holes, having a predetermined composition, and composed of different gas components is introduced to the inside of the processing chamber.

The electromagnetic wave and the magnetic field generated by the first high-frequency power supply 101 that is electric field forming means and the solenoid coil 106 that is magnetic field forming means are supplied to the inside of the processing chamber to excite the treatment gas introduced to the inside of the processing chamber, and the treatment gas is made into plasma in a space in the discharge block 124 above the sample stand 141. At this time, the treatment gas molecules are ionized into electrons and ions, or dissociated into radical. The circumference of the region where plasma is generated is surrounded by the discharge block 124 arranged on the discharge block base 121, and the heater 122 connected to a first temperature controller 123 surrounding the outer peripheral side wall of the discharge block 124 is attached on the outer peripheral side wall of the discharge block 124, so that the quartz inner cylinder 105 being in contact with the plasma can be heated.

Such a configuration can reduce adhesion of the reaction product to the quartz inner cylinder 105 and the discharge block 124. Therefore, these members can be excluded from the target of regular maintenance.

The sample stand 141 on which the wafer is placed is arranged inside the processing chamber so as to match the central axis of the shower plate 103. When a process using plasma is performed, the wafer that is the wafer 200 is placed on a circular mounting surface that is the upper surface of the sample stand 141, and the process is performed in a state where the wafer is adsorbed and held (electrostatic chuck) by the film static electricity of a dielectric configuring the surface.

In the embodiment, in consideration of use of the wafer 200 as a sample such as a semiconductor substrate having a diameter of 300 mm, the inner diameter of the cylindrical processing chamber, for example, the diameter of the inner wall surface of the upper container 130 is 600 mm. However, other dimensions can be used. For example, the diameter of the wafer 200 can be 450 mm, and the inner diameter of the processing chamber can be 800 mm.

In addition, a high-frequency bias power supply (second high-frequency power supply) 243 is connected to an electrode arranged inside the sample stand 141, and an etching process proceeds by a mutual reaction between a physical reaction caused by attracting charged particles in the plasma to the surface of the sample by high-frequency bias formed above the sample stand 141 and the sample 200 mounted thereon by high-frequency power to be supplied and by allowing them to collide with each other, and a chemical reaction between the radical and the wafer surface. In addition, the temperature of the sample stand can be controlled to a desired temperature by the second temperature controller 144.

The application of the high-frequency bias to the sample stand 141 and the temperature control of the sample stand 141 are performed through a power supply wiring cord, a temperature control wiring cord, or a refrigerant pipe arranged in a cavity formed inside the sample stand base 142 including the support beam. Note that although not shown in the drawing, a temperature sensor and an electrostatic chuck wiring cord can be included in addition to the above-described wiring cords. The reaction product easily adheres to the upper container 130 arranged around the sample stand 141, and thus the upper container 130 is a target member of the regular maintenance.

Under the processing chamber, an exhaust pump 170 connected to the bottom of the processing chamber via a base plate 160 having an exhaust opening is arranged. The exhaust opening provided in the base plate 160 is arranged directly below the sample stand 141, exhaust conductance can be adjusted by vertically moving an exhaust lid 161 having a substantially disk shape arranged on the exhaust opening using a cylinder 162, and the amounts of the inner gas, plasma, and products discharged to the outside of the processing chamber by the exhaust pump 170 and the velocity thereof are adjusted.

The exhaust lid 161 is open when the wafer is processed, and the pressure of the space inside the processing chamber is maintained at a desired vacuum degree by balancing the supply of the treatment gas and an operation of the exhaust means such as the exhaust pump 170. In the embodiment, the pressure during the process is adjusted to a predetermined value in a range of 0.1 to 4 Pa.

In the embodiment, a roughing pump such as a turbomolecular pump or a rotary pump provided in a building where a vacuum processing apparatus is installed is used as the exhaust pump. Note that the exhaust lid 161 is configured in such a manner that the exhaust lid 161 is closed at the time of maintenance and the exhaust pump can be sealed in vacuum by an O-ring.

Further, in the embodiment, the reference numeral 1011 denotes a first gate valve, the reference numeral 1012 denotes a second gate valve, the reference numeral 1015 denotes a valve box, and the reference numeral 180 denotes a pole.

In the embodiment, the treatment gas introduced to the inside of the processing chamber, the plasma, and the reaction product during the process pass through the space on the outer peripheral side of the sample stand 141 from the upper part of the processing chamber and are moved to the opening provided in the base plate 160 below through the lower container 150 by an operation of the exhaust means such as the exhaust pump 170. The reaction product easily adheres to the lower container 150, and thus is a target member of the regular maintenance.

The pressure inside the processing chamber during the etching process is monitored by a vacuum gauge (not shown in the drawing), and is controlled by controlling the exhaust velocity by the exhaust lid 161. The supply of the treatment gas, the operations of the electric field forming means, the magnetic field forming means, the high-frequency bias, and the exhaust means are adjusted by a control apparatus (not shown) connected in a communicable manner.

As the treatment gas used for the plasma process, a single kind of gas or a gas obtained by mixing plural kinds of gases at an optimum flow rate ratio is used for each process condition. The flow rate of the mixed gas is adjusted by a gas flow rate controller (not shown in the drawing), and the mixed gas is introduced to a space for allowing a gas to stay between the shower plate 103 and the lid member 102 above the processing chamber at the upper part of the vacuum container through the gas introduction ring 104. A stainless steel gas introduction ring was used in the embodiment.

Next, procedures of carrying the wafer 200 to the inside of the plasma processing apparatus 100 and carrying from the plasma processing apparatus 100 will be described. When the wafer 200 is conveyed, the gate valve is opened in advance, and a conveyance robot arranged inside a vacuum conveyance chamber 1004, which is a space reduced in pressure inside a vacuum conveyance container that is another vacuum container arranged while sandwiching a valve box 1015 with respect to the upper container 130 of the plasma processing apparatus 100, conveys the wafer 200 in the chamber. In this state, the processing chamber and the vacuum conveyance chamber 1004 inside the plasma processing apparatus 100 are connected to each other via gates that are two passages in which the first gate valve 1011 and the second gate valve 1012 are opened and closed.

In a state where the pressure inside the processing chamber and the vacuum conveyance chamber 1004 of the plasma processing apparatus 100 are equal or the former is slightly lower, each of the first gate valve 1011 and the second gate valve 1012 opens the gate, and the vacuum conveyance robot 110 having arms carries the wafer 200 from the vacuum conveyance chamber 1004 to the inside of the processing chamber. Next, the wafer 200 is passed to the sample stand 141 above the sample stand 141 in the processing chamber, the vacuum conveyance robot 110 leaves the processing chamber and returns to the inside of the vacuum conveyance chamber 1004, and the second gate valve 1012 is closed. Thereafter, a predetermined process such as etching is applied to a film layer to be processed that is preliminarily formed on the upper surface of the wafer 200 using the plasma formed in the processing chamber. Note that during the operation in which the wafer 200 is processed, the first gate valve 1011 is kept open.

When the process for the wafer 200 is completed in the processing chamber, the first and second gate valves 1011 and 1012 are opened again. When the wafer 200 is lifted upward from the sample stand 141 and is released from the upper surface of the sample stand 141, the vacuum conveyance robot 110 enters the inside of the processing chamber, and receives the wafer 200 to be carried out to the vacuum conveyance chamber 1004, as similar to the case in which the wafer is carried in. Thereafter, if there is a wafer 200 to be processed next, the next wafer 200 is carried into the processing chamber. If there is no wafer 200 to be processed next, the second gate valve 1012 is closed again, and the process for the wafer 200 in the plasma processing apparatus 100 is terminated.

Figure 2:
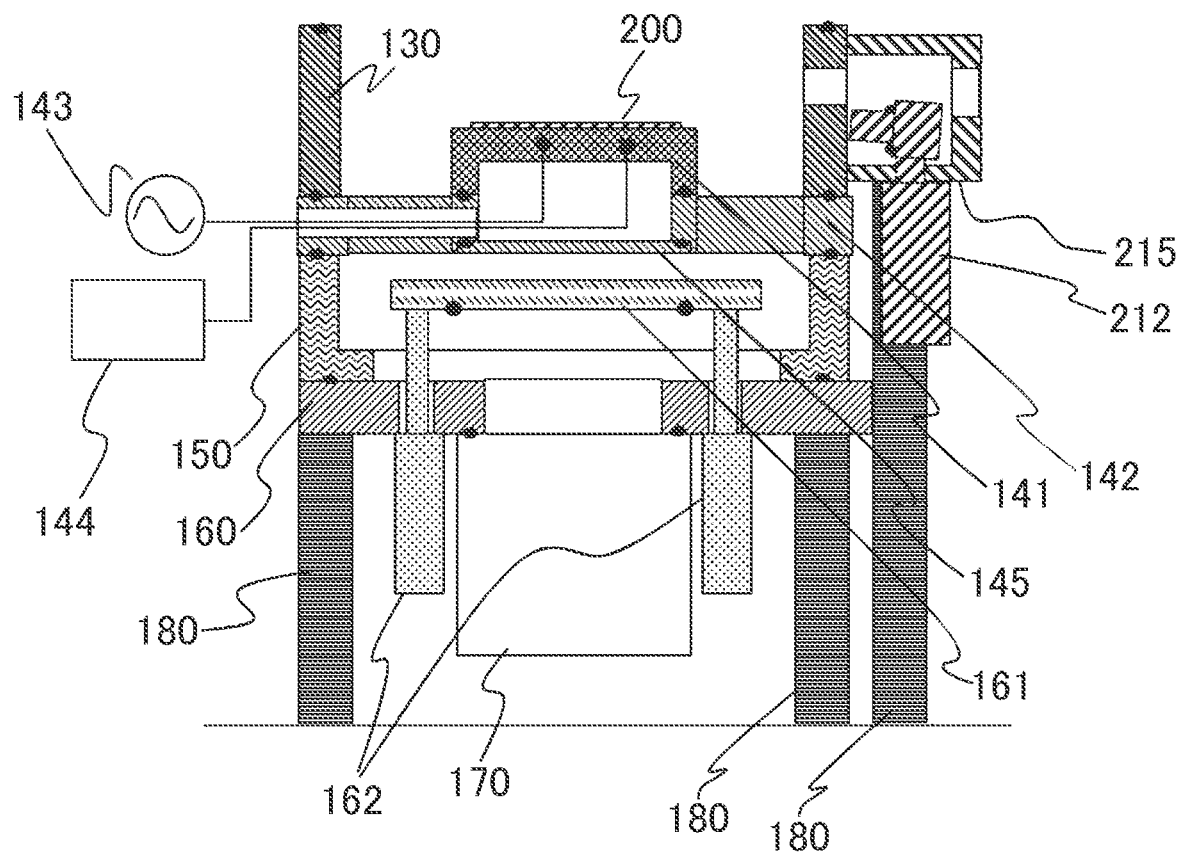
FIG. 2 is a vertical cross-sectional view for schematically showing an outline of a configuration of the plasma processing apparatus according to the embodiment shown in FIG. 1.
Figure 3:
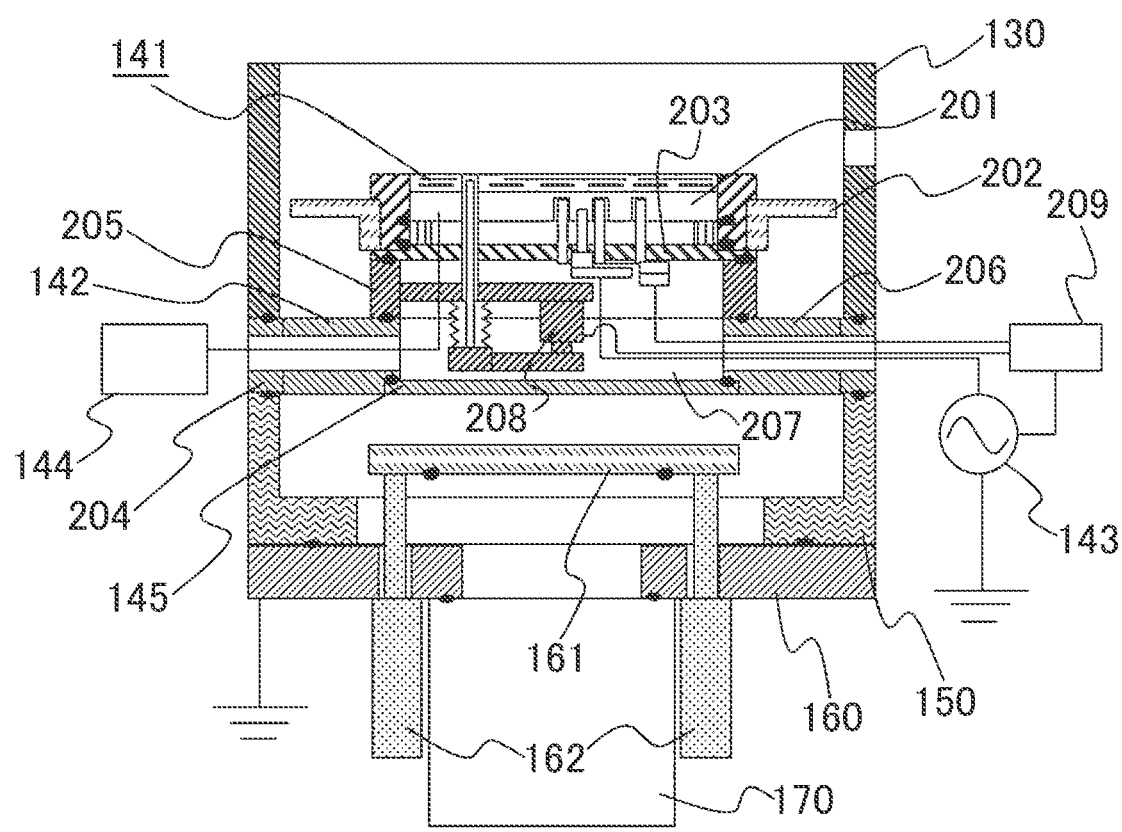
FIG. 3 is a vertical cross-sectional view for schematically showing an outline of a configuration of the plasma processing apparatus according to the embodiment shown in FIG. 1.

Next, the configuration of the plasma processing apparatus according to the embodiment will be described in more detail using FIG. 2 to FIG. 3. FIG. 2 and FIG. 3 are vertical cross-sectional views each schematically showing an outline of the configuration of the plasma processing apparatus according to the embodiment shown in FIG. 1.

FIG. 2 is an enlarged vertical cross-sectional view for particularly showing the lower part of the plasma processing apparatus 100 shown in FIG. 1, and the members such as the first high-frequency power supply 201, the lid member 202, and the coil 206 arranged at the upper part of the plasma processing apparatus 100 are omitted. That is, a portion of the plasma processing apparatus 100 shown in FIG. 1, which is lower than the upper container 130, is shown by being enlarged. The plasma processing apparatus 100 shown in the drawing roughly includes the vacuum container, a frame arranged under the vacuum container to support the vacuum container from below, and exhaust means connected under the frame and communicating with the inside of the vacuum container to exhaust the inside.

Note that in the drawing, the explanation of the portions to which the reference numerals shown in the drawing described above in FIG. 1 are assigned is omitted unless necessary. Further, shown are the second gate valve 1012 arranged at the side wall of the vacuum container and abutting on the side wall around a gate that is an opening communicating between the inside and the outside of the vacuum container to close and airtightly seal or open the gate, and the box 1015 having the second gate valve therein.

The vacuum container of the plasma processing apparatus 100 in the drawing includes the upper container 130, the sample stand base 142 under the upper container 130, and the lower container 150 arranged under the sample stand base 142, and is configured so that these are placed so as to form layers in the vertical direction. The lower container 150 is placed on the base plate 160 in such a manner that the lower surface of the lower container 150 comes into contact with the upper surface of the base plate 160.

Further, the plasma processing apparatus 100 includes plural poles 180 whose upper ends are connected to the base plate 160 to support the base plate 160 and the vacuum container above the base plate 160 between the lower surface of the base plate 160 that is a frame and the floor surface of a building where the plasma processing apparatus 100 is arranged. In addition, the plasma processing apparatus 100 includes the exhaust pump 170 that is arranged under a through hole while communicating with an exhaust port for internal exhaust arranged at the central portion of the base plate 160 in the space between the lower surface of the base plate 160 and the floor surface formed by supporting the base plate 160 with the poles 180, and the cylinder 162 as an actuator that is arranged inside the lower container 150 to vertically drive the exhaust lid 261 opening or airtightly closing the exhaust port with respect to the exhaust port.

Note that the base plate 160 is electrically connected to the ground electrode, and is set to be the ground potential even in the plasma processing apparatus 100. Therefore, the lower container 150, the sample stand base 142, and the upper container 130 whose lower surfaces come into contact with the base plate 160 to be connected are set to be the ground potential.

The exhaust means includes the exhaust pump 170 such as a turbomolecular pump arranged under the exhaust port that is through hole arranged in the lower container 150 and the base plate 160 while communicating with the exhaust port, and an exhaust duct (not shown in the drawing) for connecting the inlet of the exhaust pump 170 and the exhaust port to communicate with each other. Note that even in the plasma processing apparatus 100 shown in the drawing, the discharge port of the exhaust pump 170 is connected to a roughing pump such as a rotary pump preliminarily arranged in a building where the plasma processing apparatus 100 is installed, and the flow rate or velocity of the exhaust discharged from the exhaust port is adjusted in such a manner that the area of the flow path of the exhaust to the exhaust port is increased or decreased by driving the cylinder 162 to vertically move the exhaust lid 161 with respect to the exhaust port.

FIG. 3 is an enlarged vertical cross-sectional view for schematically showing the configuration of the main part including the sample stand base 142 shown in FIG. 2. In particular, the enlarged configuration of the sample stand 141 that is connected to the sample stand base 142, arranged inside the processing chamber within the vacuum container configured using the upper container 130, the sample stand base 142, and the lower container 150, and holds the wafer 200 placed on the upper surface is shown in more detail.

As similar to FIG. 2, in the plasma processing apparatus 100 shown in the drawing, the vacuum container, the base plate 160 arranged under the vacuum container, and the exhaust means arranged under the base plate 160 are arranged in the vertical direction. Further, the vacuum container is configured in such a manner that the upper container 130 whose inner side wall surface has a cylindrical shape, the sample stand base 142, and the lower container 150 are connected to each other in the vertical direction, and the central axes thereof in the vertical direction match each other in the horizontal direction or are arranged at positions close to the degree regarded as the matching.

The sample stand block is configured to roughly include the sample stand base 142 configuring the lower portion, the sample stand 141 that is mounted thereabove and connected thereto and includes a head part 201 having a cylindrical shape, and an outer ring 202 that is arranged in a ring shape while surrounding the sample stand 141 above the sample stand base 142 on the outer peripheral side of the sample stand 141. In the embodiment, these parts are attached or detached to/from the vacuum container or the lower part thereof and can be replaced in a state where the inside of the vacuum container is opened to the atmospheric pressure when the maintenance such as parts replacement and inspection is performed for the plasma processing apparatus 100.

The head part 201 configuring the upper part of the sample stand 141 is configured to include the base plate 203 that is a circular plate-like member made of metal, a disk-like or cylindrical base material made of metal that is mounted above the base plate 203, and a film made of a dielectric that is arranged while covering the circular upper surface of the base material. As will be described later, the base plate 203 and the base material having the film made of a dielectric are connected to each other and are integrally detachable.

The sample stand base 142 is a member that functions as a frame above which the sample stand 141 is mounted, and includes: a base cylinder having a cylindrical shape; a T-flange 205 which is mounted above the central portion of the base cylinder and connected thereto, above which the head part 201 is mounted, and which is connected to the outer peripheral lower surface of the base plate 203; and a storage space 207 which is a space inside the base cylinder and the T-flange 205. As will be described later, the storage space 207 is a space in which a pin drive part 208 that vertically moves plural pins for vertically moving the wafer 200 above the head part 201, a sensor connected to the head part 201, a connector to an electrode, and the like are arranged therein, and is set to the atmospheric pressure or the same pressure as that inside a building where the plasma processing apparatus 100 is installed.

The base cylinder is configured to include a ring-like base ring 204 which configures the outermost peripheral part and whose upper and lower parts are sandwiched between the upper container 130 and the lower container 150 to configure the vacuum container, a central cylinder having a cylindrical shape arranged on the center side of the base ring 204, and plural support beams 206 which are integrally configured by connecting therebetween. In the embodiment, the inner periphery of the base ring 204 and the outer periphery of the central cylinder have cylindrical shapes having different radii whose centers in the vertical direction match each other or which are arranged at positions in the horizontal position close to the degree regarded as the matching, and the support beams 206 are arranged in such a manner that the axes thereof are arranged along the radius direction radially from the position of the central axis and the angles between the adjacent axes are the same or are set to values close to the degree regarded as the same.

The sample stand lid 245 can be attached or detached to/from the lower surface of the central cylinder, and is attached to the central cylinder so as to airtightly seal and close the storage space 207 therein. The storage space 207 includes a tubular space arranged so as to penetrate and communicate with the inside of the central cylinder and the outside of the plasma processing apparatus 100 within each support beam 206 and the base ring 204.

The T-flange 205 has a cylindrical outer peripheral part and a space configuring the storage space 207 therein, and the pin drive part 208 is arranged in the space. The upper end of the cylindrical outer peripheral part and the lower end of the cylindrical outer peripheral part face or abut on the lower surface of the outer peripheral edge of the base plate 203 thereabove and the upper end of the central cylinder of the base cylinder thereunder, respectively, while sandwiching a seal member such as an O-ring therebetween.

Inside the storage space 207 in the sample stand base 142, arranged are a pipe of a refrigerant supplied to the head part 201 and wirings such as a power feed cable to a sensor or electrode, in addition to the pin drive part 208. In addition, a passage in the support beam 206 configuring the storage space 207 is a space in which pipes and cables connecting between a power supply and a supply source of a refrigerant arranged outside the sample stand 141 and the plasma processing apparatus 100 are installed.

Plural temperature sensors inserted into plural concave parts arranged inside the base material to detect the temperature of the base material are configured in such a manner that the ends thereof are arranged within the storage space 207 and are communicably connected, by cables, to the base ring 204 through the space within the support beam 206 or a container controller 209 arranged outside the plasma processing apparatus 100, and an output of each temperature sensor emitted during the process of the wafer 200 can be received by the container controller 209. In addition, the pin drive part 208 is similarly connected to the container controller 209 communicably by a cable, and the operation of the pin drive part 208 is adjusted in accordance with a command signal from the container controller 209.

In addition, high-frequency power having a frequency smaller than the frequency of the electric field for forming the plasma is supplied to the base material made of metal during the process of the wafer 200, and bias potential is formed on the wafer 200 placed on the upper surface of a film made of a dielectric. In the embodiment, a connector for receiving high frequency power for forming bias potential from the second high-frequency power supply 243 is inserted into and electrically connected to the base material and attached to the head part 201, and a power feed cable for electrically connecting between the end of the connector arranged inside the storage space 207 and the second high-frequency power supply 243 is arranged within the storage space 207 including the space inside the particular support beam 206.

Further, inside the base material made of metal, arranged is a refrigerant flow path in which a refrigerant whose temperature is adjusted to a value within a predetermined range is supplied and circulated. The temperature of such a refrigerant is adjusted in the second temperature controller 144 including a temperature controller using a refrigeration cycle such as a chiller, and the refrigerant is supplied to the refrigerant flow path inside the base material by an inner pump, the heat exchanged and discharged refrigerant is returned to the second temperature controller 144, and is supplied to the refrigerant flow path inside the base material again after the temperature is adjusted again. The pipe of the refrigerant connecting the refrigerant flow path and the second temperature controller 144 to each other is also arranged in the storage space 207 including the space of the support beam 206.

The container controller 209 includes an arithmetic unit, and is arranged outside the plasma processing apparatus 100 or the vacuum container to be communicably connected to plural devices such as the pin drive part 209 arranged at the sample stand 141 and inside the storage space. The container controller 209 receives signals from communicably-connected devices to detect information contained in the signals, and transmits command signals to these devices to adjust the operations thereof.

The container controller 209 of the embodiment includes an arithmetic unit configured using a semiconductor device, an interface that transmits and receives signals to/from devices, and a storage device such as a memory device such as a RAM or ROM or a hard disk drive that stores and records or memorizes data therein, and these are communicably connected inside the container controller 209. The container controller 209 having received a signal from the outside through an interface allows the arithmetic unit to detect information from the signal to store the information in the storage device, reads software preliminarily stored in the storage device to calculate a command signal corresponding to the previous signal according to an algorithm described in the software, and transmits the command signal to a device to be controlled through the interface.

The storage device of the container controller 209 may be housed inside the container controller 209 or arranged to be communicable to the outside. The container controller 209 of the embodiment is communicably connected to the temperature sensor and the pin drive part 208.

Figure 4:
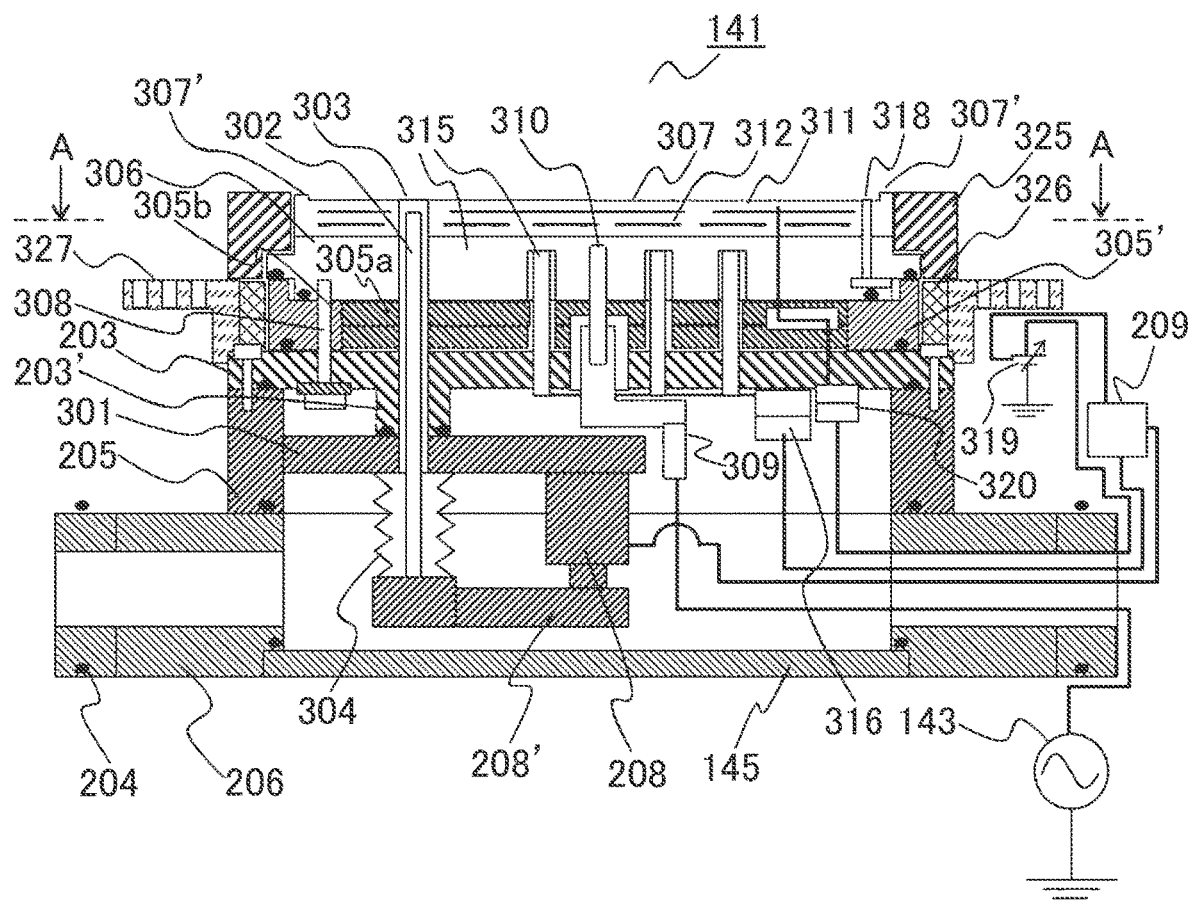
FIG. 4 is an enlarged vertical cross-sectional view for schematically showing a configuration of a sample stand according to the embodiment shown in FIG. 2.
Figure 5:
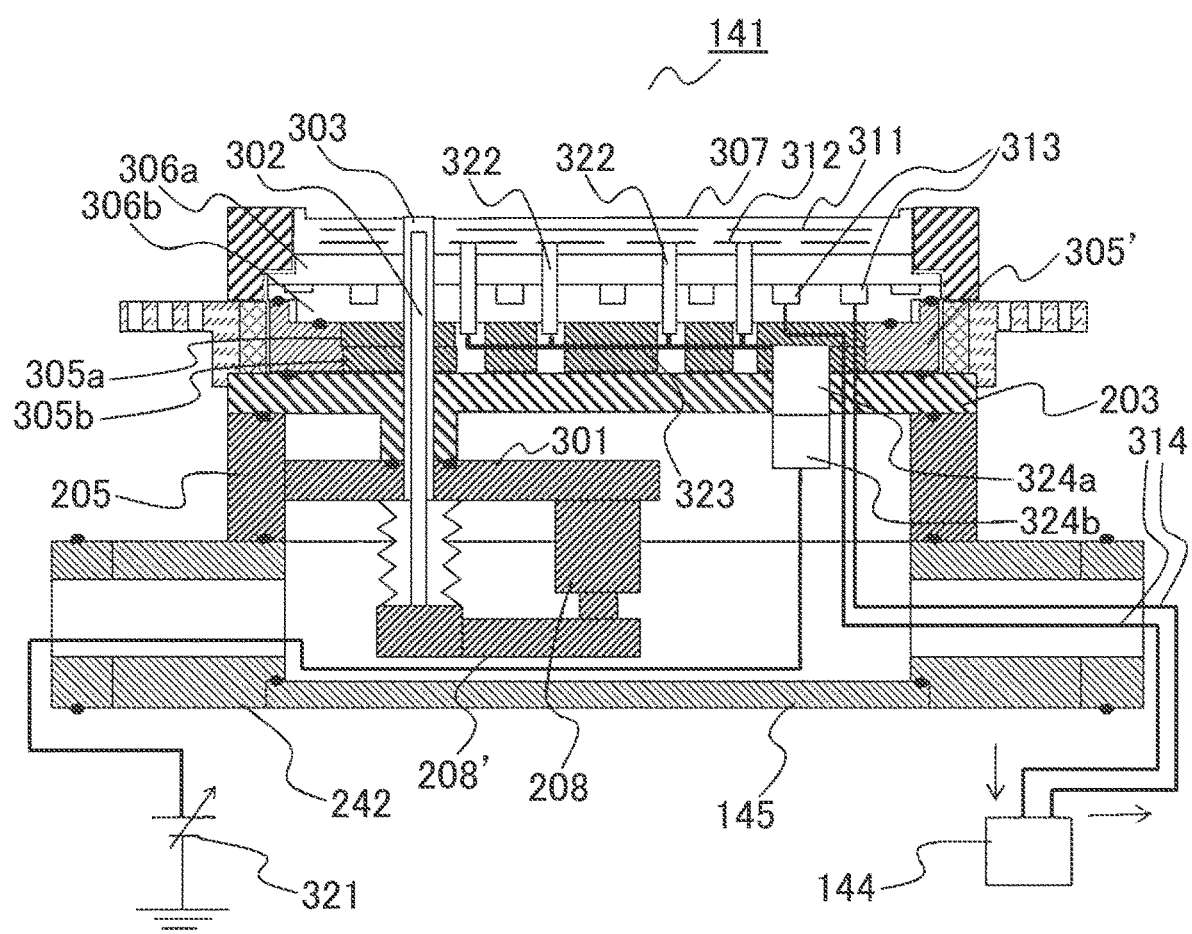
FIG. 5 is an enlarged vertical cross-sectional view for schematically showing a configuration of the sample stand according to the embodiment shown in FIG. 2.

The configuration of the main part of the sample stand block shown in FIG. 3 will be described in more detail by enlarging the same. FIG. 4 and FIG. 5 are enlarged vertical cross-sectional views each schematically showing a configuration of the sample stand according to the embodiment shown in FIG. 2. In the example, FIG. 4 and FIG. 5 are diagrams each showing a cross section taken along the plane in the vertical direction passing through the central axis of each of the sample stand 141 and the sample stand base 142 in different directions.

The sample stand block shown in FIG. 4 is configured to include the sample stand 141, the sample stand base 142, and the outer ring 202. As shown in FIG. 10, the sample stand block is configured in such a manner that after the upper portion above the sample stand base 142 including the upper container 130 of the plasma processing apparatus 100 is removed from the sample stand base 142, the sample stand base 142 is rotated around the axis in the vertical direction of a turning lifter 210, and can be moved together with the sample stand 141 from above the lower container 150 thereunder.

As shown in FIG. 4 and FIG. 5, the sample stand block is configured in such a manner that the sample stand 141 having the base plate 203 on the lower surface thereof is placed above the sample stand base 142, and these are detachably connected through fastening means such as bolts. In this state, the outer ring 202 made of metal is arranged above the upper surface of the outer peripheral edge of the base plate 203 on the outer peripheral side of the sample stand 141.

The sample stand base 142 includes the base cylinder having the outer ring 205, the support beam 206, and the central cylinder and the T-flange 205 that is arranged above the base cylinder so as to abut on or face the base cylinder while sandwiching a seal member such as an O-ring therebetween. The sample stand base 142 further includes the storage space 207 in which these are connected to each other and arranged.

The T-flange 205 has a cylindrical part having a cylindrical shape as described above and configuring the outer peripheral side wall of the sample stand base 142 in the plasma processing apparatus 100, and a T-shaped or Y-shaped beam part 301 that is arranged within the storage space 207 inside the cylindrical part and is integrally connected to or formed with the inner peripheral wall having a cylindrical shape of the cylindrical part. Further, the upper end and the lower end of the cylindrical part are arranged while being sandwiched by the base plate 203 of the head part 201 of the sample stand 141 and the central cylinder of the base cylinder, respectively, through the O-ring, and the storage space 207 is airtightly sealed with respect to the plasma processing apparatus 100.

In addition, the T-shaped or Y-shaped beam part 301 is arranged inside the cylindrical part while the ends thereof are integrally connected to or formed with the inner peripheral wall surface of the cylindrical part, and a space for configuring the storage space 207 is formed between plural beams extending from the center of the beam part 301 to the inner peripheral wall surface of the cylindrical part. Such a space between the beams serves a route through which wirings such as cables of the sensor and the connector connected to the inside of the head part 201 through the base plate 203 and pipes of a refrigerant and a gas are arranged to pass.

The beam part 301 is a plate-like member including each beam, the tip end of each beam is integrally connected or formed at a position in the middle of the upper and lower ends in the height direction of the inner peripheral wall surface having a cylindrical shape of the cylindrical part, a space is formed between the upper surface of the beam part 301 and the lower surface of the base plate 203 thereabove in a state where the base plate 203 is placed above the T-flange 205 and the inside is sealed, and the space with the base plate 203 is also used as a space in which the connector and the sensor are arranged. Further, the upper end of the pin drive part 208 is connected to the lower surface of the central portion of the beam part 301 as described above, and holes through which plural (3 in the embodiment) pins 302 that are connected to the lower end of the pin drive part 208 and move in the vertical direction according to extension/contraction operations of the pin drive part 208 in the vertical direction penetrate are arranged in each beam.

These pins 302 penetrate through the head part 201 including the base plate 203 thereabove, and are inserted into through holes 303 in communication with an opening arranged on a film made of a dielectric configuring the upper surface of the head part 201 to allow the wafer 200 placed above the film made of a dielectric to be vertically released, approached, and placed with respect to the upper surface of the head part 201 or the sample stand 141 by the above-described movement in the vertical direction. Therefore, the space on the outer peripheral side of the pin 302 located within the storage space 207 communicates with the plasma processing apparatus 100, and a sealing member such as an O-ring is arranged around the through hole for the pin of the beam part in order to airtightly seal between the storage space 207 above and under the through hole for the pin of the beam part and the space communicating with the inside of the plasma processing apparatus 100 on the outer peripheral side of the pin 302.

That is, in the lower portion of the base plate 203, convex parts 203', in each of which a through hole 303 having a cylindrical shape or a truncated cone shape protruding downward from the lower surface of the base plate 203 around the lower portion and housing each pin 302 penetrating therein is arranged at the central portion, are arranged at plural locations (3 locations in the embodiment). In a state where the base plate 203 and the T-flange 205 are vertically connected to each other, the lower end surface of each convex part 203' and the upper surface of the outer periphery of the through hole for the pin arranged in each beam of the beam part 301 abut on or face each to sandwich a seal member such as an O-ring and to airtightly seal between the space inside the through hole for the pin of each beam and the through hole 303 in the head part 201 and the storage space 207 outside.

Each pin 302 is connected to the upper surface of the tip end of each of three arms connected to the lower end of the pin drive part 208 by vertical extension/contraction operations of the pin drive part 208 whose upper end is connected to the lower surface of the central portion of the beam part 301 in the storage space 207, and extends from the upper surface of the tip end of each arm to the inside of the through hole 303 in the head part 201. The tip end of each pin is located at the maximum height above the upper surface of the sample stand 141 in a state where the pin drive part 208 is most contracted, and is located inside the through hole 303 in the head part 201 in a state where the pin drive part 201 is most extended.

On the outer periphery of each pin 302 located under each beam of the beam part 301, arranged is a bellows 304 that connects between the lower surface of each beam and the upper surface of each arm to which each pin 302 is connected and contracts in accordance with the vertical movement of the arm and the pin 302. The upper and lower ends of the bellows 1034 connected to the lower surface of each beam and the upper surface of each arm are connected to the lower surface of the beam and the upper surface of the arm so as to abut on or face each other while sandwiching a sealing member such as an O-ring therebetween, and a space between the inside of the bellows 302 communicating with the inside of the plasma processing apparatus 100 and the storage space 207 on the outer side through the through hole 303 in which each pin 302 is housed and the through hole of the beam of the beam part 301 is airtightly sealed.

With such a configuration, the pin 302 is moved in the vertical direction according to the extension/contraction between the maximum and minimum of the pin drive part 207 driven by a command signal from the container controller 209, and the bellows 304 is extended and contracted. The space between the insides of the bellows and the through hole 302 and the storage space 207 is airtightly sealed against the movement of the pin 302 and the extension/contraction operations of the bellows 304. Therefore, even during the operation of the plasma processing apparatus 100 for processing the wafer 200, it is possible to suppress the plasma, particles having reactivity of the treatment gas, and particles of the reaction product formed in the plasma processing apparatus 100 from adversely affecting the terminals of the pin drive part 208, the sensor, the connector, and the like arranged in the storage space 207.

The head part 201 configuring the sample stand 141 of the embodiment is configured to include the base plate 203, the insulating member 305 placed thereabove, and the base material 306 made of metal placed thereabove, and a dielectric film 307 configuring the mounting surface on which the wafer 200 is placed and configured by including ceramics such as yttria or alumina is arranged on the upper surface having a circular shape of the disk-like or cylindrical base material 306. A sealing member such as an O-ring is sandwiched among the base plate 203, the insulating member 305, and the base material 306 to be integrally connected to each other, the inside of the plasma processing apparatus 100 and the space of the inside of the sample stand block communicating with the storage space 207 are airtightly sealed, and the head part 201 is attached to the sample stand base 142 as a group of members and can be removed upward.

That is, the base plate 203 has a disk shape, and is fastened to the base material 306 thereabove through the insulating member 305 placed thereabove by a bolt 308 made of metal inserted from below the base plate 203 through the through hole arranged at the outer peripheral part. Accordingly, the base plate 203, the insulating member 305, and the base material 306 are integrally connected to each other.

Further, the diameter of the base plate 203 having a disk shape is larger than those of the insulating member 305 and the base material 306 whose outer peripheries have a disk or cylindrical shape and which are arranged thereabove, and the base plate 203 is fastened to the upper end of the cylindrical part of the T-flange 205 whose upper end faces or abuts on the lower surface of the outer peripheral edge of the base plate 203 while sandwiching an O-ring therebelow by a bolt on the outer peripheral side of the insulating member 305. Accordingly, the head part 201 is integrally removed upward from the T-flange 305 or the sample stand base 142 by releasing the fastening of the bolt on the outer peripheral side.

As shown in FIG. 5, the base material 306 is a member obtained in such a manner that the lower surface of a metal upper base material 306a and the upper surface of a metal lower base material 306b having a disk or cylindrical shape are allowed to abut on each other and are joined together by means such as brazing or friction stirring, and refrigerant flow paths 313 are arranged inside the lower base material 306b. Further, in a concave part formed in the central portion inside the upper base material 306a and formed so as to have an opening downward in the drawing, a power receiving connector 310 to which high-frequency power from the second high-frequency power supply 142 is supplied is inserted and connected to the base material 306.

The lower part of the power receiving connector 310 comes into contact with and is electrically connected to a power feed connector 309 connected to the tip end of the power feed cable. Along with the promotion of a process in which charged particles in the plasma are attracted in the direction of the upper surface of the wafer 200 and collide in accordance with a difference between the bias potential formed above the upper surface of the wafer 200 placed on the head part 201 or above the mounting surface thereof by the high-frequency power supply supplied from the second high-frequency power supply 243 to the base material 306 and the plasma, the wafer 200 and the base material thereunder are heated.

In order to adjust the temperatures of the wafer 200 and the base material 306 or the head part 201 changed by heating to a value within a desired range suitable for the process, a refrigerant set to a predetermined temperature by the second temperature controller 144 is supplied to and circulated in the refrigerant flow path 313 inside the base material 306, and a gas having heat transfer property such as He is supplied between the upper surface of the dielectric film 307 on the base material 306 and the rear surface of the wafer 200 placed thereon to be adsorbed and held. In the embodiment, a gas flow path 317 which is arranged in a ring shape on the outer peripheral side of the base material 306 and through which a gas having heat transfer property flows, and a gas supply path 318 which is a through path communicating with gaps among the gas flow path 317, the wafer 200, and the dielectric film 307 and communicating with an opening arranged on the upper surface of the dielectric film 307 configuring the mounting surface on the base material 306 are provided in the sample stand 141.

A gas having heat transfer property is supplied from the gas supply path 318 to a gap between the gas supply path 318 and the upper surface of the dielectric film 307 through an opening, the heat transfer of the refrigerant supplied to the wafer 200 and the base material 306 and circulating in a circulation path 313 therein is promoted, and the amount thereof is increased. The temperature of the wafer 200 or the upper surface of the base material 306 can be controlled by the temperature value, the flow rate, or the velocity of the refrigerant and the pressure value and the distribution of the gas having heat transfer property in a gap.

As described above, the base material 306 made of metal has a relatively large heat capacity compared to the wafer 200, and the refrigerant set to a temperature within a predetermined range from the second temperature controller 144 is supplied. The base material 306 serves as a base for the temperature value of the wafer 200 which is placed thereabove and whose temperature is to be adjusted, and also functions as an electrode to which high-frequency power is supplied to form the bias potential above the wafer 200.

As described above, the upper base material 306a that a disk or cylindrical member made of metal has a concave part arranged in a ring shape while the outer peripheral portion thereof surrounds the central side, and the central-side portion surrounded by the concave part is a cylindrical part having a convex shape upward from the bottom surface of the concave part. The circular upper surface of the convex portion of the upper base material 306a is covered with the dielectric film 307, and the upper surface of the dielectric film 307 is used as the mounting surface of the wafer 200.

The circular mounting surface of the upper surface of the convex portion has the same diameter as the wafer 200 or a diameter close thereto, and in a state where the wafer 200 is placed on the mounting surface during and before and after the period of the process, electrostatic force is formed between the wafer 200 and the dielectric film 307 by power which is supplied from plural DC power supplies to plural locations inside the dielectric film 307 and whose value is adjusted, and is absorbed and held on the upper surface of the dielectric film 307, or the value of the temperature of the wafer 200 or the distribution thereof is adjusted by generating heat by the supplied DC power.

That is, the dielectric film 307 is configured using ceramics containing yttria or alumina as a material, and particles of the material are sprayed in a semi-molten state onto a region of a larger upper surface including the entire region serving as the mounting surface of the upper base material 306a by a thermal spraying method to form a film shape in the embodiment. Inside the dielectric film 307, arranged are plural film-like ESC (electrostatic adsorption) electrodes 311 to which DC power for forming electrostatic force for adsorbing the wafer 200 is supplied, and plural film-like heater electrodes 312 used as heaters for heating and adjusting the temperature of the wafer 200 to a value within a desired range suitable for the process.

The ESC electrodes 311 are plural film-like electrodes arranged in a region below the projection surface of the mounting surface of the dielectric film 307 covered with the wafer 200 in a state where the wafer 200 is placed. The ESC electrodes 311 of the embodiment are formed by a thermal spraying method as similar to the dielectric film 307.

Two of the plural ESC electrodes 311 are connected to DC power supplies 319 that are different from each other, and are imparted with potentials of different polarities. Charges are polarized and accumulated within the wafer 200 while sandwiching a ceramic material configuring the dielectric film 307, and electrostatic force that attracts and holds the wafer 200 during the process in the direction of the dielectric film 200 is formed. Further, by imparting polarities opposite to those during the process to the ESC electrodes 311 after the process of the wafer 200, the polarization of the accumulated charges to form the electrostatic force for adsorbing the wafer 200 before or during the process is relaxed or removed to the container even after the plasma disappears.

Each ESC electrode 311 is electrically connected to the upper part of an ESC electrode power feed cable connector unit 320 attached to the lower surface of the base plate 203 through a power feed route penetrating the base plate 203, the insulating member 305, and the base material 306. Further, the lower part of the ESC electrode power feed cable connector unit 320 connected thereto under the upper part of the ESC electrode power feed cable connector unit 320 to which the plural ESC electrodes are electrically connected is electrically connected to one of the DC power supplies 319 arranged outside the plasma processing apparatus 100 and assigned to supply DC power to the plural ESC electrodes 311 through one power feed cable arranged in the storage space 207.

The DC power supply 319 is configured to be capable of variably adjusting the magnitude of the current or voltage to be output, and is communicably connected to the container controller 209. A signal indicating the value of the current or voltage is transmitted from the DC power supply 319 to the container controller 209, and the DC power supply 319 having received a command signal transmitted by the container controller 209 using an arithmetic unit supplies DC power obtained by adjusting the magnitude of the voltage or current by the DC power supply 319 based on the command signal to the plural ESC electrodes 311 connected thereto through the power feed cable outside the sample stand 141 and plural power feed routes inside the sample stand 141.

The heater electrodes 312 are plural film-like electrodes made of metal arranged at lower positions in the height direction inside the dielectric film 307, and each heater electrode is formed by a thermal spraying method as similar to the dielectric film 307 and has a circular, fan-like, or arc-like shape. Each heater electrode 312 is electrically connected through each of plural heater power feed connectors 322 arranged under each heater electrode and at least one heater power feed connector unit 323 to adjust the amount of heat generated when DC power with the current or voltage adjusted to a desired value in the DC power supply 321 is supplied.

As shown in FIG. 5, a heater power feed connector 322 electrically connected thereto under each of the heater electrodes 312 has a lower end that penetrates the lower part of the dielectric film 307 under the heater electrode 312 and the base material 306 thereunder and is exposed from below the lower surface of the lower base material 306b to the inside of the storage space 207. The lower end of the heater power feed connector 322 penetrates the base plate 203 and is electrically connected to a heater power feed connector unit 323 located under the lower base material 306b through a connecting cable 322' that passes through the inside of the insulating member of the heater power feed connector 322 and is electrically connected to a connecting terminal.

In addition, the heater power feed connector 322 includes therein a connecting terminal made of metal that is electrically connected to the connecting cable 322' to form a power feed route, and an insulating boss made of a dielectric that is arranged on the outer peripheral side thereof to insulate the connecting terminal from the base material 306. Each heater power feed connector 322 is inserted into an insertion hole arranged in the base material 306 from therebelow, and is attached to the base material 306.

In this state, the connecting terminal of the heater power feed connector 322 is electrically connected to the heater electrode 312 inside the insertion hole, and comes into contact with a connecting terminal on the heater side extending downward from the upper part of the insertion hole inside the insulating boss of the heater power feed connector 322, or one of the connecting terminals is fitted inside the other to connect both the upper and lower connecting terminals. The lower end of the heater power feed connector 322 is connected to the power feed route inside an insulator and the upper part of the heater power feed connector unit 323 attached to the base plate 323 in a space inside the insulating member 305 between the base plate 203 and the base material 306 through the connecting cable 322'.

As will be described later, the gap or space on the center side of the insulating member 305 and the base material 306 is a space communicating with the storage space 207 and configuring a part thereof, and the inside and the outside are airtightly sealed by a sealing member such as an O-ring arranged to surround them on the outer peripheral side thereof. Therefore, as similar to the storage space 207, the connector on the power feed route and the connecting part of the cable arranged in the space are set to the atmospheric pressure or a pressure of a value close to the degree regarded as the atmospheric pressure irrespective of whether or not the plasma processing apparatus 100 is operated.

The heater power feed connector unit 323 is a connector including a terminal for connecting and disconnecting on the power feed route attached to the base plate 203, and has upper and lower two parts.

A heater power feed connector unit upper part 323a is connected to connecting cables 323' of the plural heater power feed connectors 322 at a point between the the upper surface of the base plate 203 and the lower surface of the base material 306. A heater power feed connector unit lower part 323b is connected to a power feed cable connected to the DC power supply 321 for the heater in the storage space under the lower surface of the base plate 203.

The heater power feed connector unit upper part 323a and the heater power feed connector unit lower part 323b are detachably configured, and in a state where both are integrally connected to each other, the DC power supply 321 and the plural heater power feed connectors 322 are electrically connected to each other by connecting the connecting terminal electrically connected to a cable provided inside each of the heater power feed connector unit upper part 323a and the heater power feed connector unit lower part 323b. Thus, the DC power output from the DC power supply 321 is supplied in parallel to the plural heater power feed connectors 322 and the plural heater electrodes 312 electrically connected thereto.

As described above, the dielectric film 307 in which the ESC electrode 311 and the heater electrode 312 are incorporated is formed by spraying and laminating each material by a thermal spraying method. First, a coating film of a lower layer of the dielectric film 307 is formed by the thermal spraying method using particles made of ceramics on the upper surface of the upper base material 306a on which irregularities are formed in advance in order for materials to easily adhere, and a film of the heater electrode 312 is formed thereon.

An intermediate layer of the dielectric film 307 made of ceramics is formed by the thermal spraying method while covering the coating film of the lower layer and the upper surface of the film of the heater electrode 312, and then the ESC electrode 311 is formed on the intermediate layer by the thermal spraying method. Thereafter, a film of an upper layer of the dielectric film 307 is formed by the thermal spraying method while covering the intermediate layer and the film layer of the ESC electrode 311.

In the dielectric film 307 laminated by the thermal spraying method, at least a surface configuring the mounting surface is scraped, and holes between particles on the surface formed by the thermal spraying method are closed to shape the dielectric film 307. In a state where the wafer 200 is placed on the upper surface of the dielectric film 307 configuring the mounting surface and is adsorbed by electrostatic force, a fluid such as a gas having heat transfer property such as He is supplied to a gap formed between the rear surface of the wafer 200 and the upper surface of the mounting surface to promote heat transfer between the wafer 200 and the sample stand 141, and the shape of the surface is adjusted so that the area contacted between the wafer 200 and the dielectric film 307 configuring the mounting surface can obtain a desired amount of heat transfer between the both.

As shown in FIG. 3(a), the power receiving connector 310 made of metal is inserted into and comes into contact with the base material 306 made of metal, and high-frequency power from the second high-frequency power supply 243 is supplied to the base material 306 that is an electrode via the power feed connector 309 and the power receiving connector 310 coming into contact therewith through the cable arranged in the storage space 207 during the process of the wafer 200 in which the plasma is formed within the plasma processing apparatus 100. In accordance with the potential difference from the potential of the plasma above the wafer 200 in a state where the wafer 200 is placed, absorbed by electrostatic force, and held on the mounting surface of the sample stand 141 by the supply of the high-frequency power, bias potential for promoting a process such as etching by attracting the charged particles in the plasma toward the upper surface of the wafer 200 to collide with the film layer to be processed on the surface is formed.

On the upper part of the lower base material 306b having a disk or cylindrical shape, arranged are multiple grooves that are concentrically or spirally arranged around the center thereof and are formed in the radius direction, and the grooves are joined to the upper base material 306a to form the refrigerant flow path 313 inside the base material 306. The inlet and outlet of the refrigerant flow path 313 are connected to ends of a pipe 314 for supplying or returning a refrigerant connected to the second temperature controller 144 inside the storage space 207 through a connecting connector arranged under the base plate 1203.

The refrigerant whose temperature has been set within a predetermined range using a refrigeration cycle such as a chiller of the second temperature controller 144 is supplied into the refrigerant flow path 313 through the pipe 314 and the inlet, and the refrigerant whose temperature has been raised by heat exchange in the base material 306 is returned to the second temperature controller 144 through the outlet of the refrigerant flow path 313 and the pipe 314 connected thereto. Then, after the temperature is adjusted to a value within a predetermined range again, the refrigerant is supplied to the refrigerant flow path 313 in the base material 306 and circulates in the closed circuit. The base material 306 is adjusted to a value within a desired range suitable for the process by such circulation and supply of the refrigerant.

In the embodiment, provided are plural gas supply paths 318 arranged while penetrating a convex part having a cylindrical shape on the upper part of the base material 306 and the dielectric film 307 configuring the mounting surface of the wafer 200 while covering the circular upper surface of the convex part, and openings arranged at plural positions on the outer peripheral side of the mounting surface of the upper surface of the dielectric film 307 communicating with the gas supply paths 318. On the outer peripheral edge of the dielectric film 307 covering the outer peripheral edge of the mounting surface of the upper base material 306a, a ring convex part 307' abutting on the rear surface of the wafer 200 is arranged on a flat upper surface that is arranged in a ring shape while surrounding the center side of the upper surface in a state where the wafer 200 placed above the mounting surface of the dielectric film 307 is adsorbed, and the plural openings are arranged on the surface of the mounting surface recessed on the center side along the ring convex part 307'.

A gas having heat transfer property supplied from the opening to a gap between the wafer 200 in the concave part that is a circular region on the central side of the ring convex part 307' and the dielectric film 307 in a state where the wafer 200 is placed becomes a state in which the end on the outer peripheral side of the region is closed by the ring convex part 307' or only a minute amount of gas having heat transfer property is leaked inside the plasma processing apparatus 100 outside the sample stand 141, and fills the inside of the concave part to reduce the variation (distribution) of the amount of heat transfer in the in-plane direction of the wafer 200. In addition, the amount of heat transfer or the temperature of the wafer 200 can be made closer to the expected amount or temperature even in a region in the circumferential direction near the outer peripheral edge of the wafer 200.

The insulating member 305 is a member configured using a material made of a dielectric, and is sandwiched and arranged between the base material 306 made of metal and the base plate 203 made of metal that are fastened by the bolt 308 in the vertical direction to insulate between them and between them and the temperature sensor 315 attached to the base plate 203 and inserted into the base material 306 therethrough as shown in FIG. 5. Further, a sealing member such as an O-ring is sandwiched, deformed, and held between the insulating member 305, and the base plate 203 and the base material 306 to airtightly seal between a space such as a gap inside the insulating member 305 and the base material 306 above the base plate 203 communicating with the storage space 207 and the inside of the plasma processing apparatus 100 outside.

The insulating member 305 of the embodiment is roughly configured using two members. Specifically, the insulating member 305 is configured to include an insulating ring 305' that is arranged on the outer peripheral side, has a ring shape, has a cylindrical outer peripheral side wall, and is made of ceramics such as alumina, and upper and lower two insulating plates 305a and 305b that are arranged in a region surrounded by the insulating ring 305' on the central side thereof and are made of elastic resin such as polytetrafluoroethylene, and a gap is arranged therebetween.

By fastening the base material 306 and the base plate 203 through the bolt 308, the upper and lower ends of the insulating ring 305' on the outer peripheral side have smooth surfaces, and sealing members such as O-rings are sandwiched between the smooth surfaces and the surfaces on the outer peripheral side of the upper and lower base material 306 and base plate 203. Accordingly, the space inside the insulating ring 305' and the space of the gap communicating with the storage space 207 of the inside between the insulating ring 305', and the base material 306 and the base plate 203 that are fastened in the vertical direction while sandwiching the insulating ring 305' therebetween using the bolt 308 are airtightly sealed from the outside.

Further, the insulating ring 305' is configured using a ceramic material such as alumina having relatively high rigidity, deformation is suppressed, and both are fastened to each other so that the positions thereof can be regarded to be fixed. Since the deformation of the insulating ring 305' is relatively small, the variation of the distance in the vertical direction between the base material 306 and the base plate 203 is reduced to less than the expected variation by fastening the base material 306 and the base plate 203 using the bolt 308 from this state, and the deterioration of the insulation between the temperature sensor 315, the base plate 203, and the base material 306 due to contact or electrical conduction therebetween can be suppressed. In addition, equipment such as a pipe, cable, and sensor attached to the base plate 203 or the base material 306 is prevented from being displaced or damaged by receiving external force in accordance with changes in the shape and dimension of each member configuring the head part 201 due to an increase or decrease in temperature in the fastening work or in the process of the wafer 200 on the sample stand 141 after fastening, or the performance of sensing and detection can be suppressed from varying.

The insulating ring 305' is a ring-like member configuring the outer peripheral portions of the head part 201 and the insulating member 305, and is sandwiched and held between the base material 306 thereabove and the base plate 203 thereunder. The upper part of the insulating ring 305' has a ring-like convex part at a part on the outer peripheral side that protrudes upward to surround the central side, and a flat upper surface at a part where the height in the vertical direction on the inner peripheral (central) side of the ring-like convex part is lower than the convex part.

In addition, in a region on the outer peripheral side of the lower part of the lower base material 306b configuring the lower part of the base material 306, a concave part whose thickness in the vertical direction is reduced and which is recessed upward when viewed from the lower surface of the lower base material 306 is arranged in a ring shape while surrounding a part on the central side. In a state where the insulating ring 307' is sandwiched and held between the base plate 203 and the base material 306, the ring-like convex part of the insulating ring 307' is engaged with the concave part on the outer peripheral side of the lower base material 306b and is inserted into the concave part, and the flat upper surface of the convex part and the flat upper surface on the inner peripheral side of the convex part face the base material 306 thereabove, and the flat lower surface faces the upper surface of the base plate 203 thereunder in a continuous manner or with a gap while sandwiching a seal member such as an O-ring therebetween.

Further, the insulating ring 305' has a through hole through the inside of which the bolt 308 fastening the base material 306 and the base plate 203 vertically penetrates and which has an opening on the upper surface on the inner peripheral side of the ring-like convex part, and the bolt 308 is inserted from below the through hole of the base plate 203 into the inside and penetrates the through hole of the insulating ring 305' arranged while matching the axial direction thereabove to be inserted and screwed into a female screw hole of the base material 306 thereabove. In addition, the base material 306 and the base plate 203 thereunder are connected and fastened to each other while sandwiching the insulating ring 305' and the O-ring therebetween.

In the embodiment, in a state where the convex part of the upper part of the insulating ring 305' is fitted into the concave part on the outer peripheral side of the lower base material 306b and abut on each other while sandwiching the O-ring therebetween or the surfaces face and are connected to each other through a gap, the position in the radius direction of the inner peripheral side wall surface of the ring-like convex part of the insulating ring 305' from the central axis in the vertical direction of the sample stand 141 or the head part 201 is larger than that of the outer peripheral side wall surface of the concave part of the lower base material 306b, and a gap having a predetermined length (width) in the radius direction is formed between the both in a ring shape around the center. The ring-like gap is airtightly connected to a connector for a pipe connected to a gas source (not shown) through a through hole for the pipe of the base plate 203, and serves as the gas flow path 317 to the inside of which a gas having high heat conductivity such as He is supplied to flow in a part on the outer peripheral side of the inside of the head part 201 in a ring shape.

The gas such as He supplied to the gas flow path 317 diffuses therein in the circumferential direction of the head part 201, and is introduced to the outer peripheral part of the mounting surface from each of plural gas supply paths 318 arranged at the same angle around the central axis of the sample stand 141. A gas having heat transfer property is supplied to plural parts on the outer peripheral side of the rear surface of the wafer 200 at the same flow rate or velocity to reduce variations in the circumferential direction of the amount of heat transfer between the wafer 200 and the base material 306 or the refrigerant inside the refrigerant flow path 313 inside the base material 306 through the dielectric film 307, and variations in the temperature of the wafer 200.

The upper and lower two insulating plates 305a and 305b arranged in a region on the central side of the head part 201 are members made of resin having relatively small rigidity as compared to the insulating ring 305', and plural through holes which penetrate the base plate 203 from the lower side of the drawing and in which plural temperature sensors 315 inserted into the base material 306 are arranged are arranged in each of the insulating plates 305a and 305b in the embodiment. Further, in the central portion of the insulating plates 305a and 305b, arranged is a through hole which penetrates the base plate 203 and in which the power receiving connector 310 inserted to the base material 306 is arranged.

The power receiving connector 310 and each temperature sensor 315 are inserted upward from the lower side of the base material 306 in the drawing, and the lower ends thereof are attached to the base plate 203 and the positions thereof are fixed in a state where the base material 306 is fastened to the base plate 203 while sandwiching the insulating member 305 therebetween.

The insulating plates 305a and 305b made of resin that are vertically laminated and arranged are provided with through holes in accordance with the temperature sensors 315 and the power receiving connector 310 penetrating therethrough. In the embodiment, in a state where the temperature sensors 315 and the power receiving connector 310 are attached to the base plate 203, predetermined gaps are arranged between the inner peripheral wall surfaces of the through holes of the insulating plates 305a and 305b, the outer peripheral side wall surfaces of the temperature sensors 315, and the outer peripheral side wall surface of the power receiving connector 310.

Each of the temperature sensors 315 in the example includes a thermocouple at the upper part, which is a sensor body having a rod-like shape, arranged in a region on the central side along the axis thereof, and extending in the axial direction, a sheath made of metal having a predetermined height in the axial direction and arranged around the outer periphery of the thermocouple, and a connector part connected or coupled to the sheath and the thermocouple and attached to the lower surface of the base plate 203. While the connector part is insulated from the thermocouple, a cable which is electrically connected to the thermocouple while passing through the inside and in which a signal from the thermocouple is transmitted is connected to the connector part. The plural cables from the connector parts of the respective temperature sensors 315 are connected to one sensor cable connector unit 316 arranged while being connected to the lower surface of the base plate 203, and is communicably connected from the sensor cable connector unit 316 to the container controller 209 as a set of cables.

Through through holes arranged at plural places of each of the insulating plates 305a and 305b and the lower base material 306b arranged at plural places of the base plate 203 and at the corresponding positions thereabove, the temperature sensors 315 are inserted into the through holes from below the base plate 203 and the tip ends of the thermocouple, and the sheath are inserted into cylindrical concave parts arranged at positions corresponding to the through holes of the upper base material 306a. In a state where the connector part is attached to the base plate 203, the thermocouple of each temperature sensor 315 does not come into contact with the inner wall surface of the concave part of the upper base material 306a.

Note that the through holes into which the respective temperature sensors are inserted and the concave parts of the upper base material 306a arranged at the positions corresponding to the through holes are arranged at places different in the radius direction and the circumferential direction with respect to the upper surface of the sample stand 141 or the base material 306 having a cylindrical or disk shape. In this state, a signal indicating the temperature detected by the thermocouple of the temperature sensor 315 is transmitted to the container controller 209, and an arithmetic unit arranged inside the container controller 209 detects the value of the temperature and the distribution thereof at each place of the temperature sensors 315 according to an algorithm of software stored in a storage device configuring the inside.

In a state where the connector part of each temperature sensor 315 is attached to the base plate 203, the sheath made of metal of each temperature sensor 315 comes into contact with and is electrically connected the base plate 203 at the lower end thereof or a connection part to the connector part. In addition, the sheath of each temperature sensor 315 has a cylindrical shape arranged around the thermocouple on the outer peripheral side of the thermocouple at a distance, and is insulated from the thermocouple.

In a state where each temperature sensor 315 is inserted into and attached to the sample stand 141 from below the base plate 203, the sheath of each temperature sensor 315 is arranged while being spaced from the base material 306. That is, the sheath is electrically insulated from the base material 306, and is electrically connected to the base plate 203.

The base plate 203 is set to be the ground potential by being electrically connected to the base plate 160 that is set to be the ground potential through the sample stand base 142 thereunder and the lower container 150. Therefore, the sheath of each temperature sensor 315 is also set to be the ground potential, so that components of the high-frequency power supplied from the second high-frequency power supply 243 to the base material 306 are suppressed from being superimposed on a signal output from the temperature sensor 315 to become noise, and the accuracy of detecting the value of the temperature inside the sample stand 141 or on the upper surface thereof in the container controller 209 or the distribution in the radius direction or the circumferential direction is suppressed from being deteriorated.

In the embodiment, as described above, the high-frequency power output from the second high-frequency power supply passes through the power feed cable, and is supplied to the base material 306 to the center part of which a power receiving connector 210 is inserted and connected through the power feed connector 309 that is connected to one end of the power feed cable and arranged in the central portion of the storage space 207 under the base plate 203 and the power receiving connector 210 connected to the power feed connector 309. Through holes into which the power feed connector 309 and the power receiving connector 310 are inserted are arranged in the center parts of the insulating plates 305a and 305b between the base material 306 and the base plate 203.

One end of the power feed connector 309 that is attached to the lower surface of the base plate 203 and is exposed to the storage space 207 is connected to the power feed cable connected to the second high-frequency power supply 144. The second high-frequency power supply 144 communicably connected to the container controller 209 adjusts the magnitude or amount of the high-frequency power output in accordance with a command signal from the container controller 209, and adjusts the magnitude and distribution of the bias potential formed above the head part 201 by the high-frequency power supplied through the power receiving connector 310.

In the embodiment, the power receiving connector 310 is an L-shaped or inverted T-shaped member. The power receiving connector 310 includes an upper member (upper part) made of a conductive material such as metal and a lower member (lower part) that has a connecting terminal electrically connected to the upper part at the upper end and connected to the power feed connector 309 at the lower end and has an L shape or an inverted T shape.

In a state where the power receiving connector 310 is inserted to the inside of the through hole arranged in the central portion of the base plate 203 and the insulating plate 305a or the insulating plate 305b and the upper part and the lower part are connected to each other, the lower part is inserted to the inside of the through hole and attached to the lower surface of the base plate 203.

The upper part of the power receiving connector 310 is a rod-like member made of metal, and is inserted into and penetrates the through hole in the central portion of the lower base material 306b. In addition, the upper part of the power receiving connector 310 is inserted into a fitting hole that is a concave part arranged in the central portion of the upper base material 306a above the through hole, and is electrically connected to the upper base material 306. In addition, the lower end of the upper part is fitted into a concave part arranged at the connecting terminal made of metal of the lower part while being connected to the lower part of the power receiving connector 310.

The lower part of the power receiving connector 210 is an L-shaped or inverted T-shaped member. In addition, a terminal connected to the lower end of the upper part made of metal, a terminal connected to the power feed connector 209 at the lower end of the L-shaped or inverted T-shaped lower part, and a power feed route connected between these terminals are provided inside the member made of a dielectric or insulator material.

In a state where the upper part and the lower part of the power receiving connector 210 are integrally connected to each other, a terminal having a fitting hole for fitting and connecting the lower end of a rod-like member made of metal configuring the upper part is arranged at the upper end of the lower part. Further, in a state where the upper part and the lower part are connected to each other, the lower part of the power receiving connector 210 having an L shape or an inverted T shape is exposed to the storage space 207 under the lower surface of the base plate 203, and the power feed connector 209 arranged within the storage space 207 is connected to the connecting terminal at one end thereof.

The power feed connector 209 is a connector for feeding high frequency power that is arranged in the center part of the body made of a dielectric or insulator material and includes a connecting terminal electrically connected to a power feed cable through which the high frequency power from the second high-frequency power supply 43 flows. The connecting terminal is exposed at one end thereof and the other end is connected to the power feed cable, or the power feed cable electrically connected to the connecting terminal is pulled out and extended therein.

The power feed connector 209 connected to the second high-frequency power supply 143 through the power feed cable is capable of being attached to and detached from the power receiving connector 210 within the storage space 207. The power feed connector 209 is attached to and detached from an edge of a part that is the L-shaped or inverted T-shaped lower part of the power receiving connector 210 attached to the head part 201 or the base plate 203 and is exposed in the storage space 207 under the lower surface of the base plate 203.

In the embodiment, in a state where the lower part of the power receiving connector 310 is exposed under the lower surface of the base plate 203 and is attached to the base plate 203, the upper end of the power feed connector 309 from which a power feed cable electrically connecting between the power feed connector 309 and the second high-frequency power supply 143 is pulled out is attached to the lower part of the power receiving connector 310. In addition, in a state where the base plate 203, the insulating member 305, and the base material 306 thereabove are integrally attached to each other, the power feed connector 309 and the power receiving connector 310 can be attached to and detached from each other, and the head part 201 can be integrally attached to and detached from the sample stand base 142.

In addition, an insulating boss having a cylindrical shape or a ring shape made of an insulating material such as ceramics or a dielectric is provided on the outer peripheral side of a portion where the rod-like upper part and lower part of the power receiving connector 310 are connected to each other while surrounding the power receiving connector 310. The insulating boss is a member that is arranged, in a state where the power receiving connector 310 is attached to the head part 201, at the central portion of the insulating plates 305a and 305b and the base plate 203 with a gap in the radius direction from a place where the insulating plate 305a or 305b, the base plate 203, and the upper and lower parts of the power receiving connector 310 are connected and with a gap in the vertical direction between the lower surface of the lower base material 306b and the upper surface of the base plate 203, and is insulated from the power feed route of the power receiving connector 310.

In such a head part 201 of the embodiment, the upper part of the power receiving connector 310 is first attached to the base material 306 to connect the both to each other. Thereafter, the insulating ring 305' and the insulating plates 305a and 305b on the central side thereof are arranged on the lower surface of the base material 306 on the lower side of the drawing, and the upper part of the power receiving connector 310 is inserted into the through hole on the inner side in the central portion to arrange the insulating boss.

Thereafter, the base plate 203 and the base material 306 are fastened using the bolt 308 while sandwiching the insulating member 305 and the insulating boss therebetween. The insulating boss made of a ceramic material also functions as a member which is arranged so that the upper and lower end surfaces thereof face the lower surface of the central portion of the base material 306 and the upper surface of the central portion of the base plate 203 through a predetermined small gap and which insulates not only between the power receiving connector 310 and the base plate 203, but also between the base material 306 and the base plate 203 as similar to the insulating member 305, and functions as a member to suppress the distance (height) of the space in the vertical direction between the both from being equal to or less than the expected value.

As shown in FIG. 5, plural heater power feed connectors 322 electrically connected to the lower surface of each of the heater electrodes 312 inside the dielectric film 307 are arranged in the head part 201. The lower end of each of the heater power feed connectors 322 is configured in such a manner that the connecting cable 323 configuring a power feed route to the heater electrode 312 is pulled out from the internal connecting terminal to be connected to a heater power feed connector unit upper part 324a of the heater power feed connector unit 324 located above the upper surface of the base plate 203, and receives DC power from the DC power supply 321 for the heater through the heater power feed connector unit 324.

The heater power feed connector unit 324 includes the heater power feed connector unit upper part 324a that is attached to the base plate 203 and is exposed above the upper surface of the base plate 203, and a heater power feed connector unit lower part 324b that is detachably attached to the lower surface of the heater power feed connector unit upper part 324a from below, is electrically connected to the power feed route therein, and is electrically connected to the DC power supply 321 for the heater.

Each of the insulating plates 305a and 305b is provided with a through hole arranged in accordance with the position of each of the heater power feed connectors 322 in the base material 306, and the lower end of the heater power feed connector 322 is housed in each of the through holes with a gap therearound in a state where the insulating plate 305 is sandwiched between the base material 306 and the base plate 203 and the head part 201 integrally configured. In a state where the insulating plates 305a and 305b are sandwiched between the base material 306 and the base plate 203 to configure the head part 201, a gap is formed therebetween, and plural connecting cables 323 for electrically connecting the respective heater power feed connectors 322 and the heater power feed connector units 324 are arranged in the gap.

Each of the heater power feed connectors 322 of the embodiment includes a cylindrical boss made of a dielectric or an insulator material and a connecting terminal arranged therein. In a state where the heater power feed connector 322 is inserted and attached to the base material 306, the upper end of the connecting terminal is electrically connected to the connecting terminal on the heater electrode 312 side, and the lower end thereof is electrically connected to the connecting cable 323.

Each of the heater power feed connectors 322 is inserted into an insertion hole configured using a through hole of the lower base material 306b and a cylindrical hole arranged in the upper base material 306a, and is fitted into and comes into contact with a connecting terminal on the heater side that is arranged at an upper end (bottom part) inside the insertion hole, is electrically connected to the heater electrode 322 thereabove, and extends downward while being insulated from the base material 306 surrounding the outer periphery inside the boss. Accordingly, the heater electrode 312 and the DC power supply 321 for the heater are electrically connected in the insertion hole communicating with the inside of the storage space 207 and set to the atmospheric pressure.

Each of the power feed cables 323 connects the lower end of each of the heater power feed connectors 322 to the upper part 324a of the heater power feed connector unit 324 located above the upper surface of the base plate 203 in a gap between the insulating plates 305a and 305b. The heater power feed connector unit lower part 324b and the DC power supply 321 are connected through one power feed cable or a set of power feed cables, and DC power from the DC power supply 321 for the heater is supplied to plural heater electrodes 312 in parallel through each connecting cable 323 branched from the heater power feed connector unit upper part 324a and each heater power feed connector 322 connected thereto.

In the embodiment, the insulating plates 305a and 305b made of a resin material are arranged with a gap between members arranged therearound, and even in the case where deformation of the base material 306 occurs in accordance with the temperature during the process of the wafer 200, the connection portion between the end of the power feed cable 323 and the heater power feed connector 322 or the heater power feed connector unit 324 is suppressed from being damaged or disconnected.

The outer ring 202 of the embodiment is a ring-like member arranged on the outer peripheral side of the sample stand 141 to cover the periphery thereof, and is configured to roughly include a susceptor ring 325, a cover ring 326, and a confinement ring 327. These members are simply placed on the outer peripheral side of the sample stand 141 without means for fastening to the sample stand 141 or fastening to each other.

In a state where the outer ring 202 is placed on the sample stand 141, the susceptor ring 325 is arranged on the upper outer peripheral side of the upper base material 306a, the cover ring 326 is arranged around the outer peripheral side surface of the head part 201 under the susceptor ring 35 and above the base plate 203, and the confinement ring 327 is arranged on the outer peripheral side of the cover ring 326 above the base plate 203. In addition, a gap having a predetermined size is arranged between opposing surfaces of the members.

In the embodiment, the outer ring 203 is attached to the sample stand 141 or the head part 201, and after the cover ring 326 is attached, the susceptor ring 326 and the confinement ring 327 are attached to the sample stand 141 in order. In the following description, after the cover ring 326 is mounted, the confinement ring 327 and the susceptor ring 325 are mounted in order. However, the susceptor ring 325 may be mounted first according to the shape and specifications of the sample stand.

First, the cover ring 326 is a member having a ring-like or cylindrical shape made of a ceramic material such as alumina or yttria. On the outer peripheral side of the cylindrical outer peripheral side wall of the insulating ring 305' of the insulating ring 305 having a cylindrical outer wall shape of the head part 201 configured in such a manner that the base plate 203 and the base material 306 are fastened to each other while sandwiching the insulating member 305 therebetween, the inner peripheral wall surface is fitted from above with a predetermined gap to be placed above the upper surface of the outer peripheral edge of the base plate 203.

In the embodiment, the size (height) of the inner peripheral wall surface of the cover ring 326 is set to be the same as that of the outer peripheral side wall of the insulating ring 305', and the cover ring 326 is arranged so as to cover the outer peripheral side wall of the insulating ring 305'. However, the embodiment is not limited to this configuration. In addition, the flat lower end surface of the cover ring 326 is placed above the upper surface of the base plate 203 while covering the upper surface between the outer peripheral edge of the insulating ring 305' and the outer peripheral edge of the upper surface of the base plate 203.

The confinement ring 327 is a ring-like member provided with a coating film made of a ceramic material such as alumina or yttria on the surface of a base body made of metal, and includes an inner peripheral side part whose vertical cross section has a cylindrical shape and a ring-plate-like flange part extending in the outer peripheral direction from the upper end of the inner peripheral side part. In this regard, the confinement ring 327 is a member having an inverted L-shaped cross section.

The diameter of the cylindrical inner peripheral side wall of the inner peripheral side part of the confinement ring 327 is slightly larger than that of the outer peripheral side wall of the cover ring 326, and in a state where the cover ring 326 is mounted on the sample stand 141, the confinement ring 327 is fitted on the outer peripheral side of the cover ring 326 from above with a gap, and is placed above the upper surface of the outer peripheral edge of the base plate 203 on the outer peripheral side of the cover ring 326. In this state, the cover ring 326 or the confinement ring 327 covers above plural bolts that are inserted from above the outer peripheral edge of the base plate 203 on the outer peripheral side of the insulating ring 305' to fasten the base plate 203 and the T-flange 205 to each other with respect to the plasma processing apparatus 100.

The base material made of metal is exposed on the bottom surface of the cylindrical inner peripheral side part of the confinement ring 327. In a state where the confinement ring 327 is placed on the upper surface of the outer peripheral edge of the base plate 203 on the outer peripheral side of the cover ring 326 and the both abut on each other, the exposed bottom surface and the exposed metal member of the base plate 203 abut on and are electrically connected to each other.

Therefore, the confinement ring 327 is electrically connected to the lower container 150 through the base plate 203 and the T-flange 205, and is set to be the ground potential during the process of the wafer 200 as similar to these. The flange part of the confinement ring 327 set to such electric potential is arranged while surrounding the periphery of the sample stand 141 in the space between the confinement ring 327 and the inner peripheral wall surface of the plasma processing apparatus 100 on the outer peripheral side of the sample stand 141 in the plasma processing apparatus 100.

Plural through holes penetrating the upper and lower surfaces in the vertical direction are arranged at the flange part having a ring disk-like shape of the confinement ring 327. The space on the outer peripheral side of the sample stand 141 of the plasma processing apparatus 100 serves as a passage through which the plasma formed in the space above the sample stand 141, the gas supplied into the plasma processing apparatus 100, or particles of reaction products formed during the process of the wafer 200 pass and flow downward, and are moved and exhausted under the sample stand 141.

By arranging the flange part at the confinement ring 327 across the flow direction in the passage, particles of the gas or neutral particles in the plasma are moved through the through hole, and the charged particles in the plasma are suppressed from being moved downward. That is, the plasma is suppressed from reaching the outer peripheral side wall surface of the sample stand 141 or the sample stand base 142 under the confinement ring 327 or the inner wall surface of the plasma processing apparatus 100 to cause interaction with the materials of the members configuring these parts or from adhering to the surface.

Further, an electrode that is set to be the ground potential at a position near the mounting surface of the wafer 200 on the upper surface of the head part 201 or the base material 306 in the height direction in the passage on the outer peripheral side of the sample stand 141 is arranged while surrounding the outer periphery of the sample stand 141 or the wafer 200 on the mounting surface. The confinement ring 327 maintains stable electrical connection with the base plate 203, and the upper surface of the bolt for fastening the head part 201 on the T-flange 205 is covered by the electrode, so that interaction caused by the bolt coming into contact with the plasma, the charged particles thereof, or reactive particles is suppressed, occurrence of abnormal discharge of the plasma during the process of the wafer 200 is suppressed to stabilize the process, and wear of the members within the plasma processing apparatus 100 caused by the above is suppressed, leading to improvement in the reproducibility of the process of the wafer 200.

In the embodiment, after the confinement ring 327 is mounted on the outer peripheral side of the cover ring 326, the susceptor ring 325 is placed above the cover ring 326 while surrounding the upper outer periphery of the head part 201. The susceptor ring 325 is a ring-like member made of a ceramic material such as alumina or yttria.

The susceptor ring 325 is inserted into a concave part which is arranged to surround the outer periphery of the mounting surface of the wafer 200 at the upper outer peripheral side part of the upper base material 306 and whose surface is lowered (stepwise) in height, and surrounds the mounting surface of the circular wafer 200 configured using the dielectric film 307 that is the upper surface of a cylindrical convex part surrounded by the concave part of the upper base material 306a or the wafer 200 placed thereon to cover the upper surface of the concave part or the outer peripheral side wall surface of the convex part with respect to the plasma in the plasma processing apparatus 100.

In a state where the susceptor ring 325 of the embodiment is mounted in the concave part of the upper part of the base material 306, the position from the center of the base material 306 of the inner peripheral edge or the mounting surface of the wafer 200 in the radius direction is slightly larger than that of the outer peripheral edge of the convex part surrounded by the concave part or the mounting surface in the radius direction, and a gap is arranged therebetween. In addition, in a state where the wafer 200 is placed on the mounting surface, the position of the outer peripheral edge of the wafer 200 in the radius direction is larger on the outer peripheral side with respect to the inner peripheral edge of the susceptor ring 326, and as a result, the outer peripheral edge overhangs and is positioned outside in the radius direction with respect to the convex part or the inner peripheral edge of the susceptor ring 326 positioned on the outer peripheral side thereof in a state where the wafer 200 is placed and held on the mounting surface.

Further, the height of the upper surface of the susceptor ring 326 of the embodiment is shorter than that of the mounting surface of the upper base material 306a or that of the flat upper surface of the ring convex part 307' by the dielectric film 307 that is arranged on the mounting surface of the dielectric film 307 or the outer peripheral end of the convex part and surrounds the center side part. The wafer 200 is arranged on the mounting surface in such a manner that the rear surface of the overhanging outer peripheral edge covers the upper surface of the inner peripheral edge of the susceptor ring 325 thereunder.

Further, although not shown in the drawing, the height of the upper surface on the outer peripheral side of the inner peripheral edge of the susceptor ring 325 is higher than that of the inner peripheral edge, and thus the wafer 200 is arranged within a region which is recessed (lowered in height) on the center side of the heightened ring-like part of the susceptor ring 326 and whose upper surface has a circular shape. Accordingly, when the wafer 200 is placed on the sample stand 141 or the mounting surface, it is possible to allow the wafer to be positioned on the center side by itself.

In addition, the thickness of the susceptor ring 325 of the embodiment in the vertical direction is larger on the outer peripheral side than on the inner peripheral side. The inner peripheral part of the susceptor ring 325 is placed on the upper surface (bottom surface) of the concave part while being fitted into the concave part, and the part having a large thickness on the outer peripheral side surrounds and covers the outer periphery of the outer peripheral side wall surface of the upper base material 306a.

Further, the flat lower surface of the part with the thickness increased on the outer peripheral side is arranged so as to face the upper end surface of the cover ring 326 with a gap therebetween. The size of such a gap and the height position of the susceptor ring 325 in the vertical direction are determined on the basis of the thickness of the inner peripheral part abutting on the bottom surface of the concave part of the upper base material 306a.

The lower end surface of the susceptor ring 326 and the gap between the cover ring 326 and the confinement ring 327 creep the distance between the plasma or charged particles inside the plasma processing apparatus 100 and the upper end of the bolt fastening the base plate 203 and the T-flange, and thus the interaction of the bolt with the plasma or charged particles is suppressed.

Figure 6A:
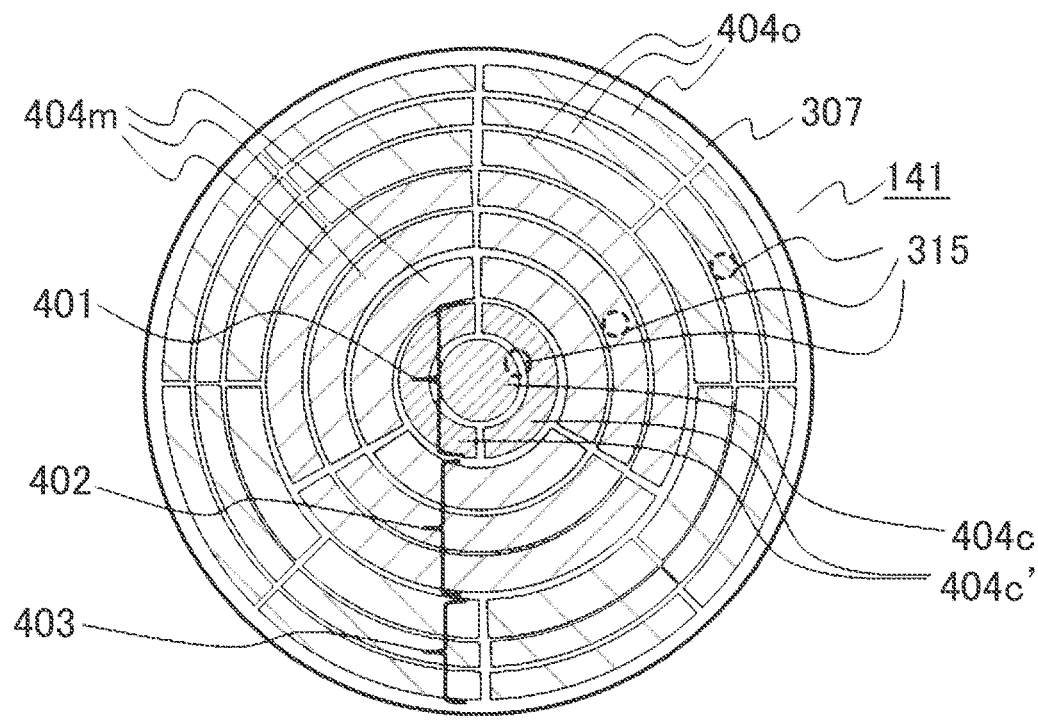
FIGS. 6A and 6B are cross-sectional views each schematically showing an outline of a configuration of plural regions in which heater electrodes in a dielectric film according to the embodiment shown in FIG. 4 are arranged.
Figure 6B:
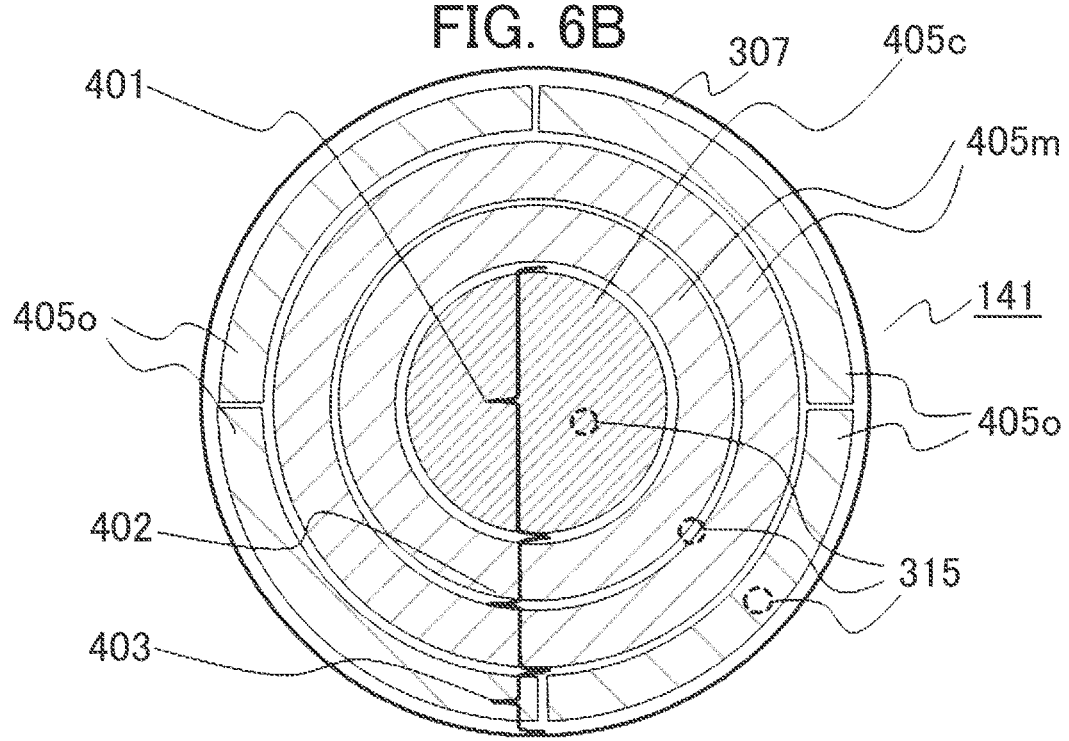

Next, a configuration of a region on the sample stand 141 where the heater electrodes 312 are arranged in the embodiment will be described using FIGS. 6A and 6B. FIGS. 6A and 6B are cross-sectional views each schematically showing an outline of a configuration of plural regions where the heater electrodes in the dielectric film according to the embodiment shown in FIG. 4 are arranged. In particular, a cross section of the dielectric film 307 cut by a plane in the horizontal direction passing through the height A-A shown in FIG. 4 is schematically shown.

In the embodiment, the heater electrodes 312 incorporated and arranged inside the dielectric film 307 arranged on the upper surface of the base material 306 of the sample stand 141 are arranged for each of plural regions divided in the radial direction from the central axis in the vertical direction toward the outer periphery and in the circumferential direction around the central axis when viewed from above on the upper surface of the dielectric film 307 on which the wafer 200 having a substantially circular shape is mounted and which configures the mounting surface of the sample stand 141. In the example, a region having a circular shape at a central portion including the central axis and ring-like regions arranged while surrounding the region on the outer peripheral side are concentrically arranged in a multiple manner with respect to the center.

Specifically, the upper surface of the dielectric film 307 arranged on the substantially-circular upper surface of the convex part of the base material 306 having a cylindrical shape of the sample stand 141 shown in FIG. 6A configures the mounting surface on which the wafer 200 is placed, and is divided into eight regions each of which occupies a range in different radius positions and is concentrically arranged in the circumferential direction around the center in the radius direction from the center toward the outer peripheral side. Further, in the seven ring-like regions arranged on the outer peripheral side of the innermost circular region including the center, each of the plural ring-like regions arranged in the radius direction is divided into plural arc-like regions (zones) extending in the range of angles which are equal with respect to the center or angles close to the degree regarded to be equal in the circumferential direction (each of the regions divided in the radius direction is also divided into plural zones in the circumferential direction).

In the drawing, each zone in each of the regions divided in the radius direction and the circumferential direction under the mounting surface has a predetermined length (width) in the radius direction and a length extending over a predetermined angular range with the same width in the circumferential direction. Inside the zones having such a shape and the circular zone at the center, arranged are the film-like heater electrodes 312 containing tungsten or alloy thereof having a predetermined width while being folded plural times in the radial direction or the circumferential direction. The area occupied by the folded heaters when viewing each zone from the upper side is set to a value close to the degree regarded as the same as that of the zone, and each zone and each circular or ring-like region configured using the zones are substantially entirely occupied by the heaters in the in-plane direction in the drawing. That is, in each zone, the heater electrodes 312 having a shape equivalent to each zone are arranged, and each is connected to the DC power supply 321.

Further, the plural ring-like regions concentrically occupying the ranges of different positions in the radius direction in the embodiment have more zones on the outer peripheral side in the radius direction from the center of the dielectric film 307 or the upper surface thereof. In FIG. 6A, one zone 404c is provided in the region of the central portion, and has a circular shape or a shape close to the degree regarded as a circular shape. In addition, two semi-circular ring-like zones 404c' having the same radius width and surrounding the entire circumference of the zone 404c are arranged outside of the zone 404c in the radius direction.

Further, on the outer peripheral side thereof, arc-like zones 404m which are concentrically triply arranged and each of which extends over the range of the angle of a ⅓ circumference (approximately 120°) are arranged to surround the entire circumference of the zone 404c in each of the triple regions. Further, on the outer peripheral side thereof, arc-like zones 404o which are concentrically triply arranged and each of which extends over the range of the angle of a ⅛ circumference (approximately 45°) are arranged to surround the entire circumference of the zone 404c in each of the triple regions. That is, 1, 2, 3, 3, 3, 8, 8, and 8 zones are arranged in the regions from the center side toward the outer peripheral side, and the sample stand 141 is provided with the heater electrodes 312 in 36 zones in total.

On the other hand, 1, 1, 1, and 4 zones are arranged in the regions in FIG. 6B. That is, double ring-like zones 405m are concentrically arranged on the outer peripheral side of a zone 405c of the central portion, and arc-like zones which are concentrically arranged on the outer peripheral side of the zones 405m and each of which extends over the range of the angle of a ¼ circumference (approximately 90°) are provided. In the example of FIG. 6B, the heater electrodes 312 are provided in 7 zones in total.

In the embodiment, the plural regions arranged at different positions in the radius direction are divided into three groups in the radius direction, and the outputs of the heater electrodes 312 are adjusted for each group to adjust the temperature and the distribution thereof of the base material 306 or the upper surface of the dielectric film 307, or the wafer 200. In FIG. 6A, the zone 404c and the two zones 404c' are sectionalized as a group 401 of the central part, the arc-like zones which are triply arranged on the outer peripheral side of the group 401 and each of which extends over the range of the angle of a ⅓ circumference (approximately 120°) are sectionalized as a group 402 of the central part, and the arc-like zones which are triply arranged on the outer peripheral side of the group 402 and each of which extends over the range of the angle of a ⅛ circumference (approximately 45°) are sectionalized as a group 403 of the outer peripheral part.

Each of the heater electrodes 312 in the zones belonging to each of the groups 401, 402, and 403 is electrically connected to the same DC power supply 321, and the same output DC power is supplied. Namely, power is supplied to the plural heater electrodes 312 of the embodiment from each of the three DC power supplies 321 corresponding to the groups 401, 402, and 403 to which each belongs. In addition, the heater electrodes 312 of the respective groups 401, 402, and 403 are electrically connected in parallel or in series to the respective DC power supplies 312 so that the amounts of heat generated by the respective heater electrodes 312 are equal to each other in the respective groups.

Further, inside the base material 306 under the groups 401, 402, and 403 of each region or zone, each temperature sensor 315 for detecting the temperature at the position corresponding to each group inside or on the upper surface of the base material 306 or on the upper surface of the dielectric film 307 is arranged in the embodiment. In the example, in accordance with a result of detecting a difference between the temperature of the upper surface of the base material 306 or the dielectric film 307 or the wafer 200 corresponding to the range of each group represented by each temperature sensor 315 along with a software algorithm read from the storage device by the container controller 209 having received an output fed back from each temperature sensor 315, the magnitude of DC power supplied to the heater electrodes 312 of the zones is calculated for each group, and the amount of heat generation and heating of the heater electrodes 312 is adjusted.

Note that in the plural zones arranged in the ring-like regions of the embodiment, the length of each zone in the circumferential direction is made sufficiently larger than the length (width) of each zone in the radial direction.

In the sample stand 141 of the embodiment having the above-described configuration, the value of the temperature of the mounting surface, the base material 306, or the wafer 200 is adjusted for each group of the plural regions on the mounting surface, and the deviation of the temperature and the distribution thereof of the wafer 200 in the in-plane direction from the expected value is reduced, thereby improving the yield of the process.

Figure 7A:
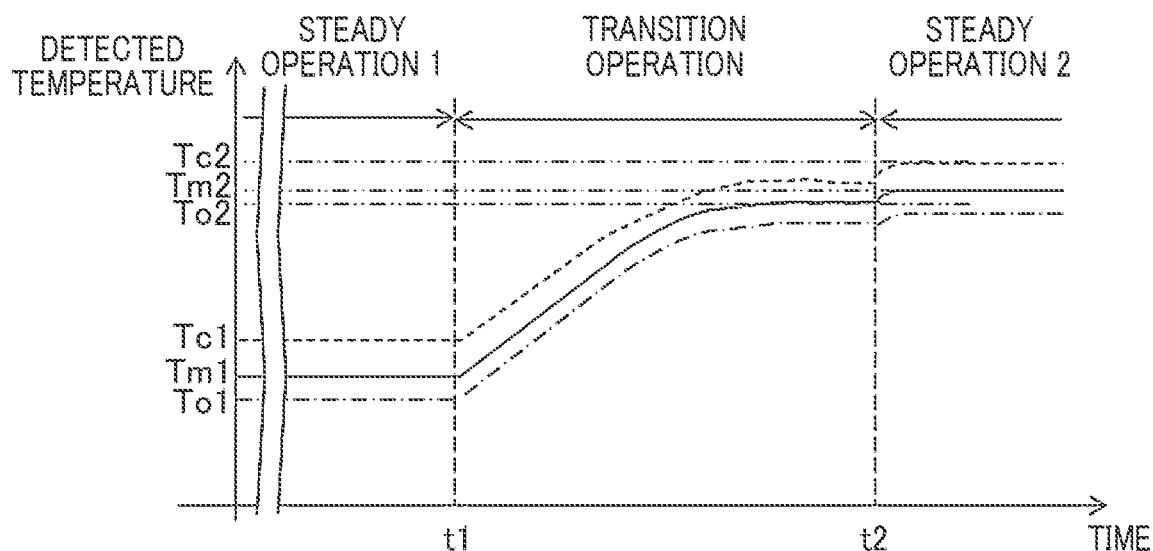
FIGS. 7A and 7B are graphs each schematically showing an example of changes in the temperature of the sample stand and the current supplied to the heater electrodes when the plasma processing apparatus according to the embodiment shown in FIG. 1 processes the wafer.
Figure 7B:
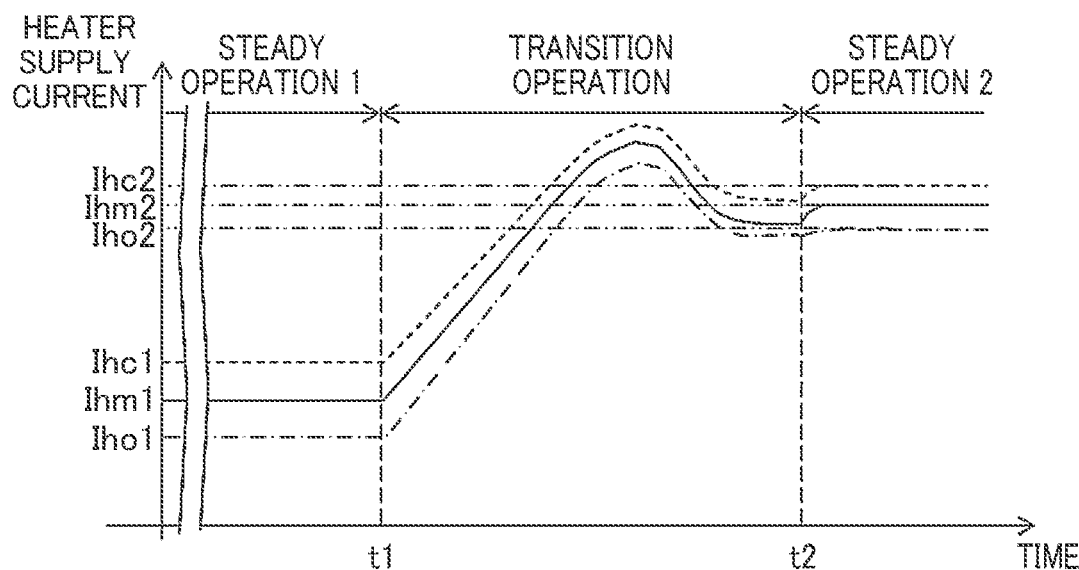

Next, an operation of adjusting the temperatures of the sample stand 141 and the wafer 200 by adjusting the power supply to the heater electrodes 312 of the sample stand 141 when the plasma processing apparatus 100 of the embodiment processes the wafer 200 placed on the upper surface of the dielectric film 307 at the upper part of the sample stand 141 will be described using FIGS. 7A and 7B. FIGS. 7A and 7B are graphs each schematically showing an example of changes in the temperature of the sample stand and the current supplied to the heater electrodes when the plasma processing apparatus according to the embodiment shown in FIG. 1 processes the wafer.

In the example, a process for etching a film layer to be processed of a film structure including a mask layer preliminarily formed on the surface of the wafer 200 and the film layer to be processed under the mask layer will be described. In addition, the etching includes plural processes (steps), and in the case where the temperature of the wafer 200 suitable for a condition of the process of one etching step is different from the temperature of the wafer 200 suitable for another etching step thereafter, an example of a process having a step of changing the temperature of the sample stand 141 or the wafer 200 placed thereon between these steps from one to the other will be described. Further, in each of the two preceding and subsequent etching steps, power is supplied to the heater electrodes 312 of each zone so as to maintain the temperatures of the sample stand 141 and the wafer 200 within a predetermined allowable range or to maintain the temperature constant, and the temperature, flow rate, or velocity of the refrigerant supplied to the refrigerant flow path 313 is adjusted. Such a step of maintaining the temperature constant is referred to as a steady operation (step of a steady operation) in the drawing, and the two preceding and subsequent etching steps are referred to as a steady operation 1 and a steady operation 2, respectively.

On the other hand, between the steady operations 1 and 2, in the step of changing the temperatures of the sample stand 141 and the wafer 200 from the former to the latter, the DC power supplied to the heater electrodes 312 in the plural zones of the sample stand 141 is increased or decreased. Such a step is referred to as a transition operation (step of a transition operation) in the drawing. Note that the temperature as a condition for the process of each step of the example shown in FIGS. 7A and 7B are changed from the low temperature of the sample stand 141 maintained in the steady operation 1 to the high temperature realized and maintained in the steady operation 2. The configuration of the embodiment is not limited to this, and the present invention can be also applied to a case in which the high temperature in the steady operation 1 is changed to the low temperature in the steady operation 2, and the same action and effect can be achieved.

FIG. 7A shows changes with the passage of time in temperature output by each of the three temperature sensors 315 arranged inside the base material 306 under the regions of the three groups 401, 402, and 403 as the central portion, the intermediate portion, and the outer peripheral portion shown in FIG. 6 and detected by the container controller 209 in the step of the etching process performed by changing the temperature condition of the above-described process. FIG. 7B shows changes with the passage of time in the value of the DC power supplied to the heater electrodes 312 in each zone of the regions of the three groups in the same step. In these upper and lower drawings, the same point on each horizontal axis is associated as the same time.

As shown in FIG. 7A, in each of the steady operation performed up to time t1 and the steady operation 2 performed from time t2, the temperature of the base material 306 detected by the temperature sensor 315 under each of the three groups is set to a value within a predetermined allowable range including Tc1, Tm1, To1, Tc2, Tm2, and To2 set as conditions for each process, and is maintained to such an extent that the temperature is regarded as being constant. As described using FIG. 6, the value of the current supplied to the heater electrode 312 in each zone is adjusted by the DC power supply 321 electrically connected to each heater electrode 312 in accordance with a command signal from the container controller 209 so as to be a predetermined constant value in the steady operations 1 and 2 in the embodiment.

In particular, in the example, the currents supplied to the zones belonging to the regions of the groups are adjusted so as to have the same value. Therefore, as shown in FIG. 7B, the currents supplied to the respective heater electrodes 312 in the zones belonging to the group 401 of the central portion, the group 402 of the intermediate portion, and the group 403 of the outer peripheral portion are set to predetermined values Ihc1, Ihm1, and Iho1 in the steady operation 1, and to predetermined values Ihc2, Ihm2, and Iho2 in the steady operation 2 that are higher than those in the steady operation, so that the currents are maintained within the allowable range. Before starting the operation of etching the wafer 200 for mass-producing and manufacturing semiconductor devices, another wafer 200 having the same configuration as that of the wafer 200 is tested in the plasma processing apparatus 100 under conditions in which the temperature is used as a parameter and the others are considered to be the same as those of the mass-production operation to acquire data obtained by associating the temperature of the sample stand 141 detected from the wafer 200 or the temperature sensor 315 with the value of the current supplied to the heater electrode 312 of each group, and the above-described values of the currents are adjusted and realized based on a command signal from the container controller 209 that calculates or selects, from the data, the current value supplied to the heater electrode 312 corresponding to the temperature detected by the temperature sensor 315 as a predetermined processing condition.

On the other hand, at time t1 after the completion of the etching step performed during the steady operation 1, the transition operation in which the temperatures detected by the respective temperature sensors 312 in the base material 306 are changed to be setting values Tc2, Tm2, To2 as conditions of the temperatures for the next etching step is started. In the embodiment, the values of the currents supplied to the plural heater electrodes 312 belonging to the respective groups 401, 402, and 403 during the transition operation are variably adjusted by so-called feedback control in which the container controller 209 having received the outputs from the temperature sensors 312 and detected the temperatures increases or decreases the values according to differences from the target values Tc2, Tm2, and To2. Therefore, as shown in FIGS. 7A and 7B, when the temperatures Tc1, Tm1, and To1 detected from the temperature sensors 315 corresponding to the respective groups are uniformly increased toward Tc2, Tm2, and To2, respectively, from the start of the transition operation at time t1 and become close to these values, the rate of increase is gradually decreased. Then, when the temperatures asymptotically approach these values, the temperature changes can be considered to be sufficiently small immediately before time t2.

In the case where the container controller 209 having received a signal from each temperature sensor 315 detects that the amount of temperature changes is within a predetermined allowable range and also detects that the values of deviations between the detected temperatures and the target temperature values Tc2, Tm2, and To2 are within another predetermined allowable range, the step of adjusting the temperature of the sample stand 141 or the wafer 200 is switched and transited to the steady operation 2 at time t2, and the values of the currents supplied from the respective DC power supplies 321 to the heater electrodes 312 are adjusted to be constant by being set to predetermined values Ihc2, Ihm2, and Iho2. As a result of such feedback control, as shown in FIG. 7B, the values of the currents supplied to the heater electrodes 312 belonging to the respective groups once exceed the values Ihc2, Ihm2, and Iho2 corresponding to the setting values Tc2, Tm2, and To2 as the conditions of the target temperatures and are increased in the transition operation. Then, the values of the currents are decreased, and changed so as to asymptotically approach the values hc2, Ihm2, and Iho2.

In the embodiment, the container controller 209 calculates the values of current amounts in accordance with the amount of differences between the temperature values detected from the signals of the respective temperature sensors 315 and the target values as described above, and transmits the values to the respective DC power supplies 321 as command signals to perform such adjustment of the current supply. For example, when the detected value from the temperature sensor 315 of an arbitrary group i is Tsim and the target value is Tsi-target, a current amount Ii supplied to each heater electrode 312 belonging to the arbitrary group is calculated based on the following equations.

$$\delta i = Tsi - Tsi_{target} \quad \text{[Equation 1]}$$

$$Ii = Kp \cdot \delta i + Kq \int \delta i \, dt \quad \text{[Equation 2]}$$

In these equations, i represents a reference numeral indicating one of the three groups by a number, and Kp and Kq represent feedback coefficients each of which is an arbitrary real number. In addition, a temperature Tsi detected by an arbitrary temperature sensor 315 during such a transition operation and the target value Tsi-target in the next steady operation are calculated based on the following equations.

[Equation 3]

$$Ts_i = \sum_{k=1}^{n} C_k^i \cdot I_k \quad (3)$$

[Equation 4]

$$Tsi_{target} = \sum_{k=1}^{n} A_k^i \cdot I_k \quad (4)$$

In these equations, k represents a reference numerical indicating one of the zones by a number, Ik represents the value of a DC current supplied to the heater electrode 312 of the zone k, and n represents a natural number indicating the number of zones. In the example, the number of groups is smaller than n. In addition, Ak and Ck that are coefficients for calculating a temperature Ts inside the base material 306 corresponding to each group can be obtained by a prior test or calibration.

In consideration of the symmetry around the central axis of the distribution of the plasma in the processing chamber of the plasma processing apparatus 100 and the distribution of the flow of particles such as plasma and products, the inventors recalled the adjustment of the temperature of the wafer 200 or the sample stand 141 and the distribution thereof by adjusting the current amount as described above in the embodiment taking into consideration that the distribution of the temperature in the circumferential direction of the sample stand 141 is sufficiently smaller than that in the radial direction, that even in the case where the processing conditions differ depending on the process (step) for processing the film to be processed of the wafer 200 in the manufacture of a semiconductor device, the distribution of the temperature in the radial direction is generally changed in many cases, and that the variation of the distribution of the temperature in the circumferential direction is sufficiently smaller than that in the radial direction.

According to the above-described embodiment, the distribution of the temperature of the wafer 200 suitable for the process can be changed and realized in a short time, and the process is performed with high accuracy to suppress the shape after the processing from varying from the expected shape, thereby improving the yield of the process.

LIST OF REFERENCE SIGNS

100 plasma processing apparatus
101 first high-frequency power supply
102 lid member (quartz plate)
203 shower plate
104 gas introduction ring
105 quartz inner cylinder
106 coil
107 O-ring
122 heater
123 first temperature controller
124 discharge block
125 earth ring
130 upper container
140 sample stand unit
141 sample stand
142 sample stand base
143 second high-frequency power supply
144 second temperature controller
145 sample stand bottom lid
150 lower container
160 base plate
161 exhaust lid
162 cylinder
170 exhaust pump
180 pole
1011 first gate valve
1012 second gate valve
1015 valve box

The invention claimed is:

1. A plasma processing method in which a wafer to be processed is mounted on a sample stand arranged in a processing chamber inside a vacuum container and plasma is formed in the processing chamber to process the wafer, wherein the sample stand having a cylindrical shape has therein a plurality of heaters which are arranged in three or more regions in a radial direction including a circular region concentrically arranged around a center and ring-like regions surrounding an outer periphery of the circular region on a plurality of radii in the radial direction from the center toward an outer peripheral side and which include one of the plurality of heaters arranged in each of a plurality of arc-like regions divided in the circumferential direction around the center of at least one of the ring-like regions, and a plurality of temperature sensors which are arranged inside the sample stand under the respective regions in the radial direction and a number of which is smaller than that of the plurality of heaters, the plasma processing method comprising:

a first step and a second step of processing the wafer; and a transition step which occurs between the first and second steps of processing the wafer in which a temperature of the wafer or the sample stand is changed from a first temperature in the first step to a second temperature in the second step, wherein the transition step further comprises adjusting an output of each of the plurality of heaters by a feedback control of an output from the temperature sensor so that the temperature of the sample stand becomes closer to a target value, and wherein the second processing step after the transition step further comprises adjusting an amount of power supplied to each of the plurality of heaters to match or maintain a predetermined value which is detected by using data obtained in advance indicating a relation between the temperature of the sample stand and the amount of power supplied to each of the plurality of heaters.

2. The plasma processing method according to claim 1, wherein the predetermined value of the amount of power supplied to each of the plurality of heaters maintains the temperature of the sample stand within an allowable range including the target value.

3. The plasma processing method according to claim 1, wherein each of the plurality of temperature sensors is arranged within a region where each of the plurality of regions in the radial direction is projected when viewed from above.

4. The plasma processing method according to claim 1, wherein each of the arc-like regions has a length in the circumferential direction larger than that in the radial direction.

5. The plasma processing method according to claim 1, wherein the heaters in the respective regions in the radial direction are adjusted to have the same output.

6. The plasma processing method according to claim 5, wherein at least one of the ring-like regions further comprises a plurality of ring-like regions concentrically arranged on a plurality of radii in the radial direction or the plurality of arc-like regions divided in the circumferential direction around the center, and the plurality of heaters is arranged inside the sample stand under the respective regions.

* * * * *